United States Patent
Badami

(10) Patent No.: US 9,200,892 B2
(45) Date of Patent: Dec. 1, 2015

(54) THERMALLY STABLE OPTICAL SENSOR MOUNT

(71) Applicant: Zygo Corporation, Middlefield, CT (US)

(72) Inventor: Vivek G. Badami, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 406 days.

(21) Appl. No.: 13/672,544

(22) Filed: Nov. 8, 2012

(65) Prior Publication Data

US 2013/0128254 A1    May 23, 2013

Related U.S. Application Data

(60) Provisional application No. 61/557,609, filed on Nov. 9, 2011.

(51) Int. Cl.
| | |
|---|---|
| *G01B 11/00* | (2006.01) |
| *G03B 27/52* | (2006.01) |
| *G03B 27/58* | (2006.01) |
| *G03B 27/62* | (2006.01) |

(Continued)

(52) U.S. Cl.
CPC ............ G01B 11/14 (2013.01); G01B 9/02049 (2013.01); G01D 5/34753 (2013.01); G03F 7/7085 (2013.01); G03F 7/70258 (2013.01); G03F 7/70775 (2013.01); G03F 7/70825 (2013.01); G03F 7/70858 (2013.01)

(58) Field of Classification Search
CPC ............ G01B 9/02049; G01B 9/0205; G01B 9/02061; G01B 11/002; G01B 11/007; G01B 11/14; G01D 5/24442; G01D 5/34753; G03F 7/70258; G03F 7/70725; G03F 7/70775; G03F 7/70825; G03F 7/70833; G03F 9/70; G03F 2009/005; H01L 21/67379; H01L 21/68; H01L 21/681
USPC .............................. 355/30, 53, 67, 72, 75, 77; 356/399–401; 359/818, 819; 901/45
See application file for complete search history.

(56) References Cited

U.S. PATENT DOCUMENTS

| | | | |
|---|---|---|---|
| 5,483,343 | A | 1/1996 | Iwamoto et al. |
| 6,884,707 | B1 | 4/2005 | Cherian |

(Continued)

FOREIGN PATENT DOCUMENTS

| | | | | |
|---|---|---|---|---|
| EP | 2 006 740 | 12/2008 | ................ | G03F 7/20 |
| JP | 2005-283566 | 10/2005 | ................ | G01B 9/02 |

(Continued)

OTHER PUBLICATIONS

Taiwan Office Action for Application No. 101141504 dated Jul. 11, 2014 (6 pages).

(Continued)

*Primary Examiner* — Colin Kreutzer
(74) *Attorney, Agent, or Firm* — Fish & Richardson P.C.

(57) ABSTRACT

Disclosed is an apparatus including a mechanical reference frame and a rigid object mechanically coupled to the reference frame by two or more constraints. The stiffnesses of at least two of the constraints are different from one another, and the relative locations and stiffnesses of the constraints cause a designated point on the rigid object to remain stationary with respect to the reference frame during thermal expansion of the rigid object over a range of temperatures.

18 Claims, 15 Drawing Sheets

(51) Int. Cl.
  *G01B 11/14* (2006.01)
  *G03F 7/20* (2006.01)
  *G01B 9/02* (2006.01)
  *G01D 5/347* (2006.01)

(56) References Cited

U.S. PATENT DOCUMENTS

| | | | |
|---|---|---|---|
| 7,755,742 | B2 | 7/2010 | Cornelissen et al. |
| 2004/0240513 | A1 | 12/2004 | Del Puerto |
| 2005/0040502 | A1* | 2/2005 | Cherian ............ 257/666 |
| 2005/0225768 | A1 | 10/2005 | Belt et al. |
| 2005/0275822 | A1 | 12/2005 | Butler |
| 2008/0062431 | A1* | 3/2008 | Goldman ............ 356/499 |
| 2009/0231561 | A1 | 9/2009 | Arai |
| 2010/0148064 | A1 | 6/2010 | Harrach et al. |
| 2011/0255096 | A1 | 10/2011 | Deck et al. |

FOREIGN PATENT DOCUMENTS

| | | | |
|---|---|---|---|
| TW | 2009-12557 | 3/2009 | ............ G03F 7/20 |
| WO | WO 2011/126610 | 10/2011 | ............ G01D 5/38 |

OTHER PUBLICATIONS

Giesen, Peter et al., Design guidelines for thermal stability in opto-mechanical instruments, Proceedings of SPIE vol. 5176,0 Optomechanics, 2003, edited by Alson E. Hatheway, 9 pages.
de Rijk, I., Design of a Metrological Atomic Force Microscope Head, Technische Universiteit Eindhoven Department of Mechanical Engineering Control Systems Technology Group, Eindhoven, Dec. 2008, 73 pages.
Werner, Chris, A 3D translation stage for a metrological AFM, Technische Universiteit Eindhoven, 2010, 196 Pages.
van Veggel, Marielle et al., Experimental set-up for testing alignment and measurement stability of a metrology system in Silicon Carbide for GAIA, Edited by Hatheway, Alson, E. Proceedings of the SPIE, vol. 5877, 2005, 12 pages.
Koops, Richard, et al., Development of the New Line Scale Calibration Facility at the Dutch National Metrology Institute VSL, Cal Lab Magazine, Category: 18-1, Mar. 12, 2011, 8 pages.
Notenboom, Arnoud et al., Mechatronic design of an active printhead alignment mechanism for wide format printing systems, Technische Universiteit Eindhoven, Department of Mechanical Engineering, Control Systems Technology Group, Mechatronics, 2007, 109 pages.
Slocum, Alexander, Kinematic couplings: A review of design principles and applications, International Journal of Machine Tools & Manufacture, 2010, 18 pages.
The International Technology Roadmap for Semiconductors, 2010 Update Overview, 2010, 74 pages.
International Search Report and the Written Opinion of the International Searching Authority, or the Declarant for International Application No. PCT/US2012/064223 dated Mar. 29, 2013.
Supplementary European Search Report for European Application No. 12 84 8391 dated Sep. 3, 2015 (3 pages).
Japanese Office Action for Japanese Application No. 2014-541273 dated Jul. 14, 2015 (10 pages).
EPO Office Action for Application No. 12848391.4 dated Oct. 1, 2015 (5 pages).

* cited by examiner

PRIOR ART

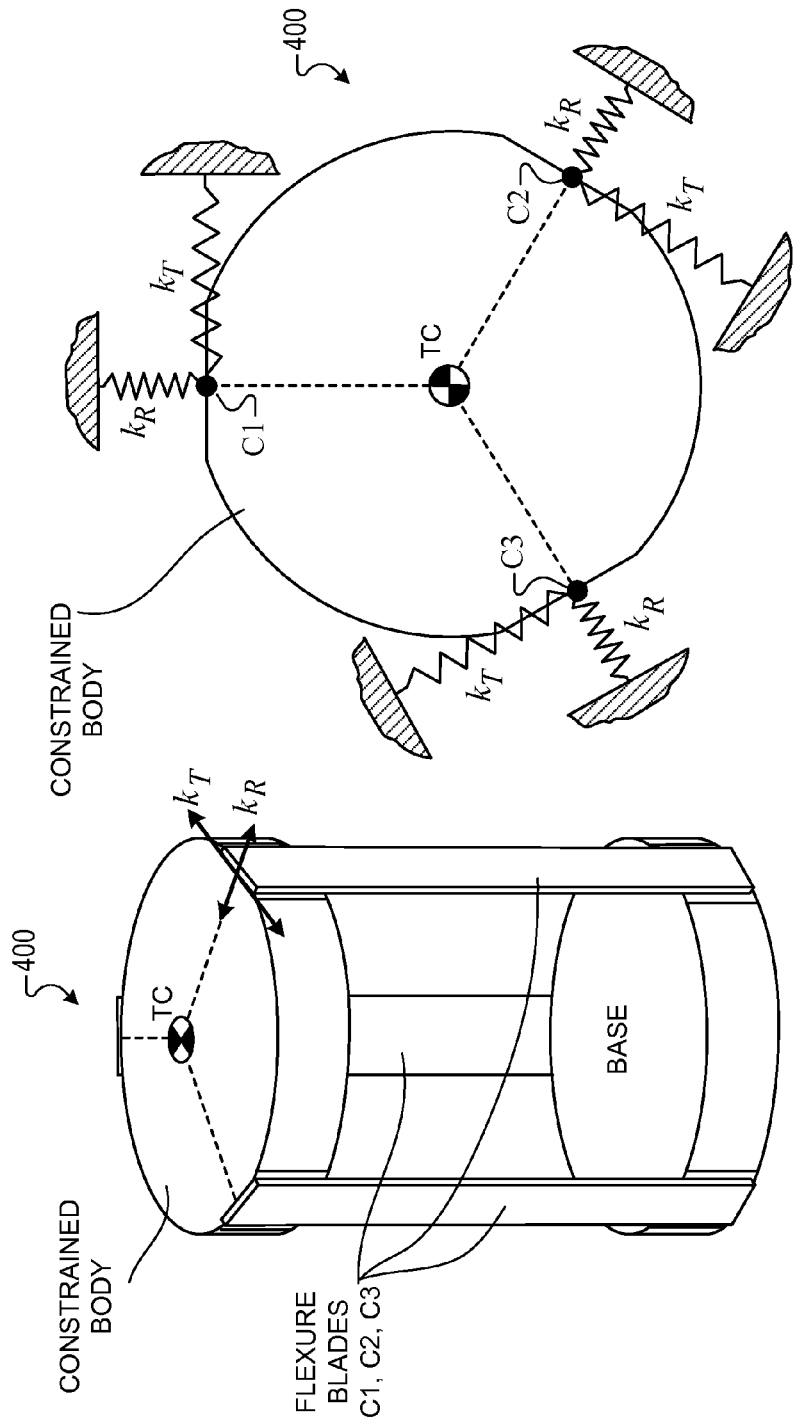

THERMALLY STABLE OPTICAL SENSOR MOUNT

CROSS-REFERENCE TO RELATED APPLICATIONS

This application claims benefit of the Provisional Application No. 61/557,609, entitled "Thermally stable optical sensor mount," filed on Nov. 9, 2011. The entire content of this priority application is hereby incorporated by reference.

BACKGROUND

The disclosure relates to a thermally stable optical sensor mount, such as optical encoder head used to monitor changes in the relative position of a wafer stage in a lithography tool based on an encoder scale.

A problem that is commonly encountered in the field of precision instrument design is the requirement to mount or attach two bodies of different coefficients of thermal expansion (CTE) in such a manner as to maintain the relative locations of the two bodies in the face of temperature, and accompanying dimensional, changes. In general, the mounting method has to accommodate the relative dimensional changes between the two bodies to prevent distortions, and constrain the location of a point of interest so as to prevent the motion of this point relative to a reference frame external to the two bodies.

FIG. 1 shows one possible arrangement of constraints 100 that satisfies the above requirements. Expansion of a body 105 relative to a reference frame (e.g., a mechanical reference frame) results in relative displacement between all parts of the body and the reference frame, except for one point known as the thermal center (TC). This point is located at the intersection of the lines that are perpendicular to the constraint lines. The thermal center is significant in that this is the point at which the probe (or tool) in an instrument is located so as to exploit the dimensional invariance of this point to obtain the required thermal insensitivity.

FIG. 2 shows constraint systems 200 that constrain one body relative to the other have thermal centers defined by the geometry of their constraints. Two example implementations of the kinematic mount are the Maxwell and Kelvin clamps, 210/215 and 250, respectively. The Maxwell clamp geometry 210/215 is often preferred over the Kelvin clamp 220 because the TC coincides with the center of the mount, e.g., in a part of the mount that is unobstructed. FIG. 3 shows modified Maxwell clamp geometries 300', 300" in contrast with the symmetric Maxwell clamp 300. The location of the TC can be modified by changing the geometry of the constraints C2 and C3, e.g., the orientation of two of the V-grooves. These mounts rely on sliding at the interfaces along a direction orthogonal to the constraint direction to accommodate relative dimensional changes between the bodies, with ideal performance being achieved only in the absence of friction at the interfaces. In the presence of friction, the behavior is less predictable and deviations from ideal behavior may be observed. The stiffness (i.e., the extent to which it resists deformation in response to an applied force) in the constraint and sliding direction is typically the same for all six points of constraint for small relative motions. For larger motions or in arrangements that eliminate or minimize friction in the sliding direction, the stiffness is essentially zero.

FIGS. 4A-4B show another approach that is often used to construct kinematic mounts 400 utilizes compliant connecting elements C1, C2, C3 between two bodies. The compliant elements C1, C2, C3 are designed so as to provide high-stiffness in the constraint direction and high compliance in the remaining translational and rotational directions. The quasi-kinematic flexure equivalent of the symmetric Maxwell clamp shown in FIG. 3 is shown in FIGS. 4A-4B. FIG. 4A shows one flexure arrangement C1, C2, C3 that produces a quasi-kinematic equivalent of the Maxwell clamp. FIG. 4B shows a top view of the constraint pattern illustrated in FIG. 4B. In each of FIGS. 4A and 4B, the respective thermal centers are shown and are located at the intersections of the (dotted) lines defining the "sliding direction" or the direction of maximum compliance. Based on the shapes of the elastic members C1, C2, C3, the stiffness in the two directions, i.e., the constraint direction $k_T$ and the sliding direction $k_R$, are determined by the geometry of the individual compliant elements C1, C2, C3. In traditional implementations, the compliant elements C1, C2, C3 are nominally identical and have the same stiffness characteristics. Again, as in the implementation using sliding contacts, the location of the TC is determined by the arrangement of the complaint elements C1, C2, C3.

SUMMARY

In general, one innovative aspect of the subject matter described in this specification can be embodied in an apparatus including a mechanical reference frame, and a rigid object mechanically coupled to the reference frame by two or more constraints. The stiffnesses of at least two of the constraints are different from one another. The relative locations and stiffnesses of the constraints cause a designated point on the rigid object to remain stationary with respect to the reference frame during thermal expansion of the rigid object over a range of temperatures.

Embodiments of the apparatus can include any of the following features. The rigid object can support a measurement probe. The designated point can be a datum of the measurement probe. For example, the different stiffnesses can be selected to cause the position of a thermal center of the rigid object to align with the measurement probe datum. In certain embodiments, the measurement probe is an optical encoder head (e.g., an interferometric encoder head) and the reference frame includes an encoder scale. The optical encoder head can be configured to optically monitor changes in position of the reference frame relative to the measurement datum. The optical encoder head can be further configured to optically monitor changes in position of the reference frame along each of multiple degrees of freedom.

The two or more constraints can include three or more constraints. The stiffness of each constraint quantifies a degree of compliance of the constraint along each of multiple directions. For example, each constraint can have a stiffness component along one constraint direction that is different from a stiffness component for the constraint along a second constraint direction that is orthogonal to the first constraint direction.

The constraints can include any of flexure, solid contacts, or combinations thereof. The flexures can include any structure dimensioned or configured to have stiffness components that vary along different constraint dimensions. For example, the flexures can be flexure blades having a higher stiffness in a constraint direction coinciding with the blade and a lower stiffness in a constraint direction perpendicular to the blade.

Another innovative aspect of the subject matter described in this specification can be embodied in a lithography system. The lithography system includes a projection objective for imaging an object at an object plane to an image plane; a mechanical reference frame comprising (i) a stage for positioning a wafer at the image plane, and (ii) an encoder scale supported on the stage; an encoder head positioned to direct light to and receive light from the encoder scale; and a mount mechanically coupled to the reference frame by two or more constraints, the mount supporting the encoder head. Stiffnesses of at least two of the constraints are different from one another. In addition, relative locations and the stiffnesses of the constraints cause a designated point on the mount to remain stationary with respect to the reference frame during thermal expansion of the mount over a range of temperatures.

Another innovative aspect of the subject matter described in this specification can be embodied in another lithography system. The other lithography system includes a projection objective for imaging a mask at an object plane to an image plane; a mechanical reference frame comprising (i) a stage for positioning the mask at the object plane, and (ii) an encoder scale supported on the stage; an encoder head positioned to direct light to and receive light from the encoder scale; and a mount mechanically coupled to the reference frame by two or more constraints, the mount supporting the encoder head. Stiffnesses of at least two of the constraints are different from one another. Additionally, relative locations and the stiffnesses of the constraints cause a designated point on the mount to remain stationary with respect to the reference frame during thermal expansion of the mount over a range of temperatures.

The details of one or more embodiments are set forth in the accompanying drawings and the description below. Other features and advantages will be apparent from the description and drawings, and from the claims.

BRIEF DESCRIPTION OF THE DRAWINGS

FIGS. 4A-4B show aspects of a quasi-kinematic equivalent of a Maxwell clamp.

Like reference symbols in the various drawings indicate like elements.

DETAILED DESCRIPTION

In certain embodiments of the present invention, the location of the thermal center of a constrained object is controlled, by controlling the stiffness of the constraints. By contrast, many conventional approaches rely on controlling the geometrical arrangement of the constraints.

Figure 1:
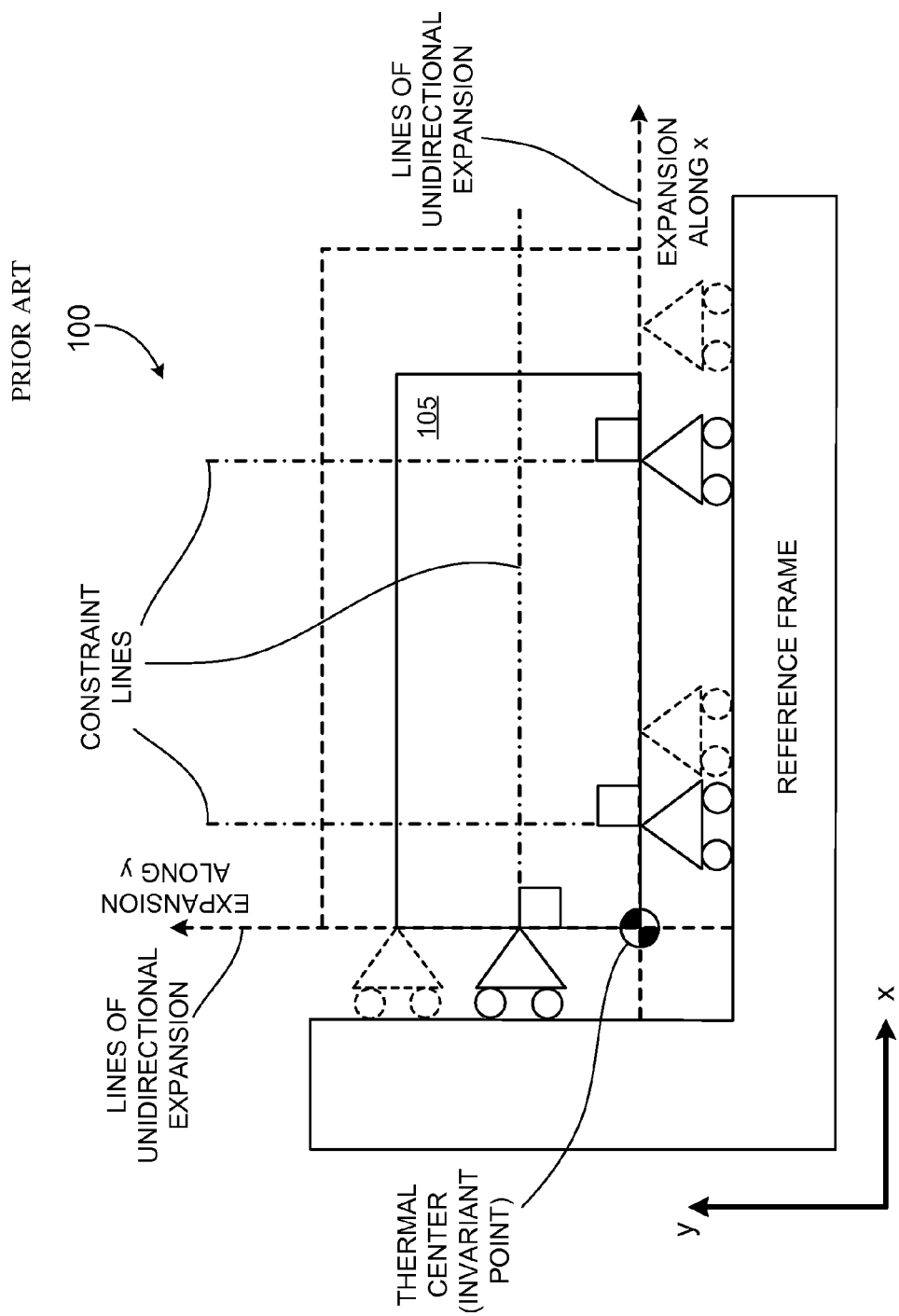
FIG. 1 illustrates the principle of thermal center (TC).
Figure 2:
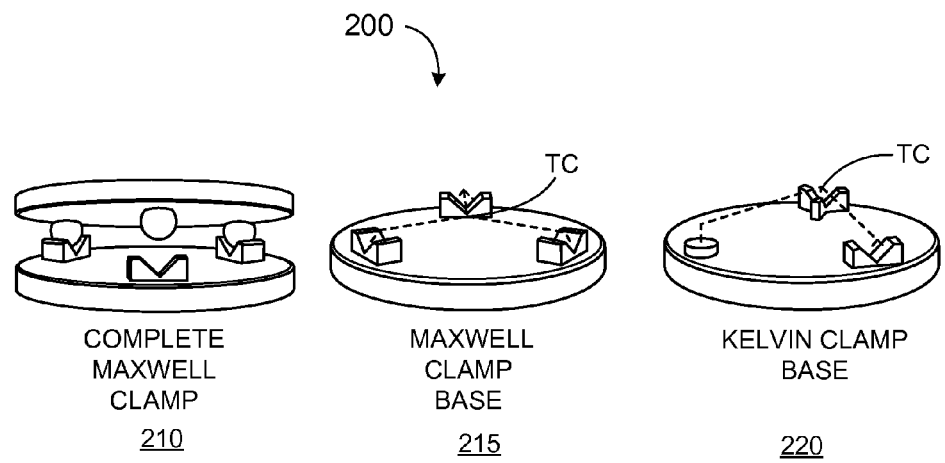
FIG. 2 shows thermal centers of examples of kinematic mounts.
Figure 3:
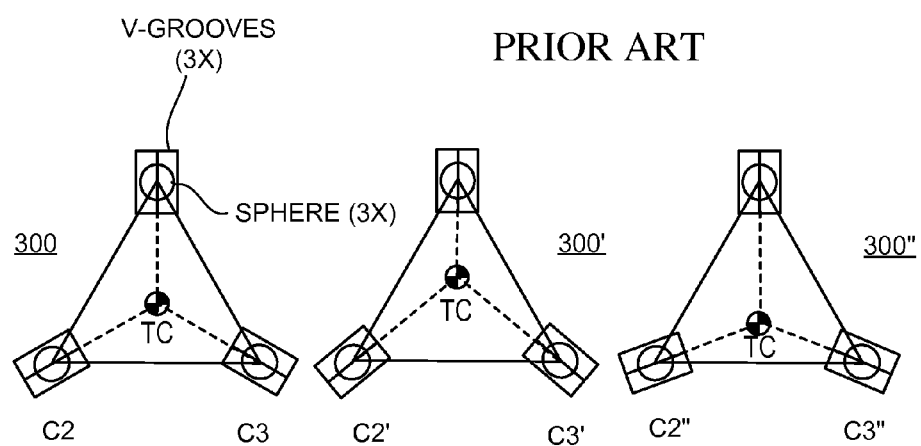
FIG. 3 shows control of TC location through constraint geometry orientation.
Figures 5A, 5B:
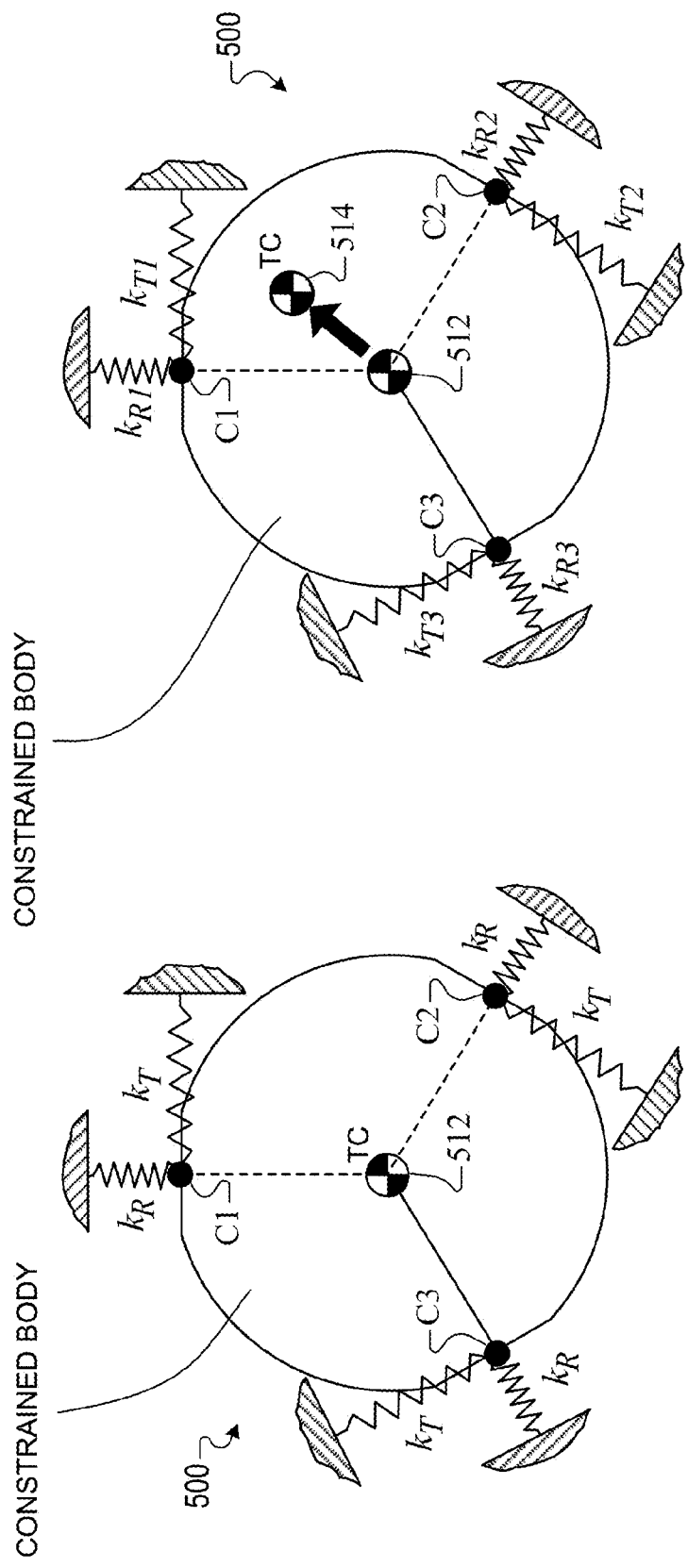
FIGS. 5A-5B show adjustment of TC by controlling constraint stiffness.

FIGS. 5A-5B show how a thermal center ("TC") may be manipulated for a flexure equivalent 500 of the Maxwell clamp. In FIG. 5A, the location of TC 512 is determined by the location and orientation of the constraints C1, C2, C3 due to the fact that the stiffnesses for all three constraints C1, C2, C3 in the radial and tangential directions are respectively the same $k_R$ and $k_T$. In contrast, in FIG. 5B, the radial and tangential stiffness, $k_{Ri}$ and $k_{Ti}$ (i=1 . . . 3) are no longer equal and, as a result, the TC moves from the location 512 determined by constraint geometry to some other point 514 determined by the relative values of the stiffnesses. Though the example used above has three constraints C1, C2, C3 (and six associated stiffnesses) this method is general and may be extended to situations having more than the exact number of constraints, e.g., to situations of overconstraint.

This capability provides an additional "knob" for the designer of optical sensor mounts, for instance, in the solution of design problems that require the simultaneous optimization of multiple performance requirements, e.g., thermal stability, dynamic performance, decoupling from base distortion, etc. These requirements are often conflicting, thus, making it difficult to realize them simultaneously. An example of this would be the commonly encountered situation where interference with another component or feature makes is difficult to place a constraint in the desired location or orientation, thereby resulting in an inability to place the TC at the desired location based on constraint geometry alone.

Embodiments described in this specification are configured to address the need to manipulate the location of the thermal center in the design of an optical encoder application, as described in detail below, so as to restore the thermal center to the desired location while also satisfying other design constraints. This led to the general notion of manipulating the stiffnesses intentionally to change the location of the thermal center in a predictable fashion.

Although, the description herein describes the manipulation of the location of the thermal center in a two-dimensional plane, the same principles may be extended into three-dimensions. Further, although the stiffness manipulation described herein is based on adjusting the stiffness of constraints composed of compliant members by changing their dimensions, other mechanisms of stiffness control can also be envisaged. For example, the contact stiffness of Hertzian contacts may be adjusted by manipulating the preload, stiffnesses of compliant elements may be adjusted by varying axial loads, changing the boundary conditions (clamping, load locations, materials), exploiting the thermal dependence of the modulus of elasticity, etc.)

The mathematics that support the qualitative descriptions above is now described. The mathematical treatment presented here is general and applied to a body with any number of constraints. This analysis is based on some assumptions: (i) Deformations of the constrained body in the plane of the constraints are not accounted for. The assumption here is that the stiffness of the constraints is significantly lower than that of the body thereby warranting its treatment as a rigid body. (ii) The analysis is constrained to a two-dimensional constraint system, although in principle it may be extended to a three-dimensional system. The formulae derived here are verified by means of finite element simulations.

Figure 6:
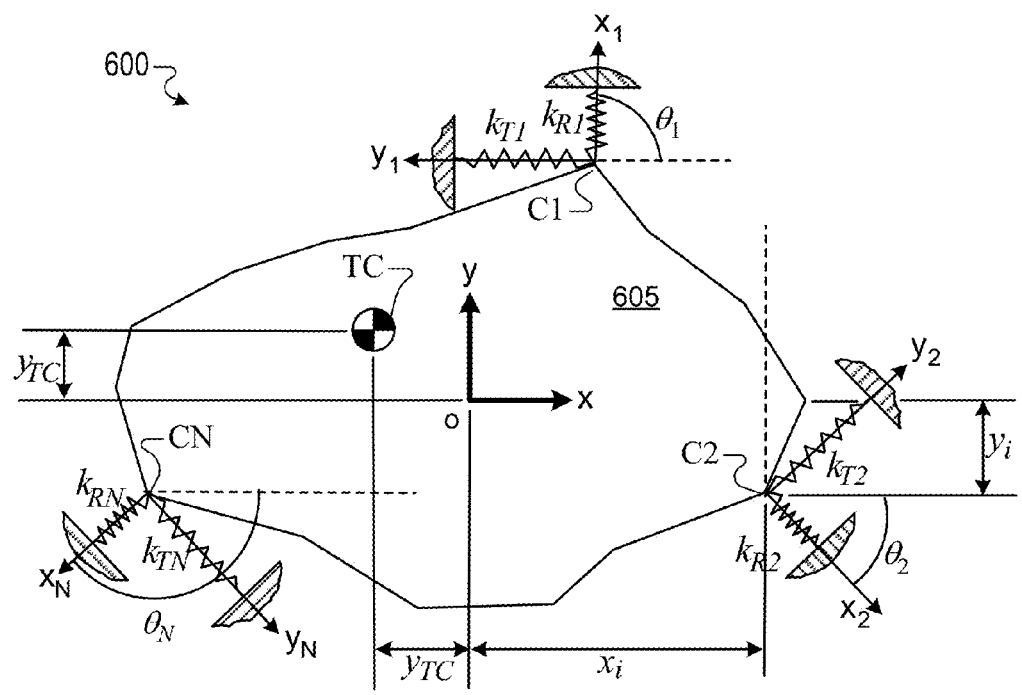
FIG. 6 shows a schematic of generalized constraints.

FIG. 6 shows a generalized constrained system 600 including a body 605 with N total constraints C1, C2, . . ., CN. The location of each constraint "i" is defined by its coordinates ($x_i$, $y_i$) in the global coordinate system with origin at O. Similarly, the coordinates of the thermal center TC are given by ($x_{TC}$, $y_{TC}$) in the same coordinate system. The stiffness at each constraint i is represented in terms of the radial (or normal) and tangential stiffness $k_{Ri}$ and $k_{Ti}$ respectively. Further, the radial stiffness is assumed to be oriented along the x axis of the local coordinate system. The orientation of the local coordinate system is described by the angle $\theta_i$ which represents the angle between the x axis of the local coordinate system and the corresponding axis of the global coordinate system. As is customary, rotations in the counter-clockwise direction are assumed to be positive.

The stiffness at each constraint $K_1$ may be described in terms of the stiffness tensor in the local coordinate system of that constraint and is given by $$k_i^{x_i y_i} = \begin{pmatrix} k_{Ri} & 0 \\ 0 & k_{Ti} \end{pmatrix} \quad (0.1)$$

The stiffness in the global coordinate system for the $i^{th}$ constraint is then given by $$k_i^{xy} = R(\theta_i) k_i^{x_i y_i} R(-\theta_i) \quad (0.2)$$

where the rotation matrix $R(\theta_i)$ is given by $$R(\theta_i) = \begin{pmatrix} \cos(\theta_i) & \sin(\theta_i) \\ -\sin(\theta_i) & \cos(\theta_i) \end{pmatrix} \quad (0.3)$$

Substituting (0.1) and (0.3) in (0.2), gives an expression for the stiffness in the global coordinate system $k_i^{xy}$ in terms of the stiffnesses in the local coordinate system $k_i^{x_i y_i}$ given by $$k_i^{xy} = \begin{pmatrix} \cos^2(\theta_i) k_{Ri} + \sin^2(\theta_i) k_{Ti} & \cos(\theta_i)\sin(\theta_i)(k_{Ti} - k_{Ri}) \\ \cos(\theta_i)\sin(\theta_i)(k_{Ti} - k_{Ri}) & \cos^2(\theta_i) k_{Ti} + \sin^2(\theta_i) k_{Ri} \end{pmatrix} \quad (0.4)$$

The location of the thermal center ($x_{TC}$, $y_{TC}$) can now be derived on the basis of a force balance in the x and y directions. The force that is generated at each constraint in a given direction is the product of the deformation of that constraint and the corresponding stiffness. The displacement is in turn proportional to the change in differential temperature $\Delta T$ between the base and the constrained object, the differential CTE $\alpha$ and the distance of the constraint from the TC. The expressions for the displacements in the x and y directions, $\Delta x_i$ and $\Delta y_i$ respectively are given by $$\Delta x_i = \alpha \Delta T(x_i + x_{TC})$$

$$\Delta x_i = \alpha \Delta T(y_i + x_{TC}) \quad (0.5)$$

The force developed at each constraint $F_i$ is then simply the product of the stiffness tensor and the displacement vector as given by $$F_i = \begin{pmatrix} F_{xi} \\ F_{yi} \end{pmatrix} = k_i^{xy} \begin{pmatrix} \Delta x_i \\ \Delta y_i \end{pmatrix} \quad (0.6)$$

Substituting (0.5) in (0.6) gives an expression for the force components at each constraint $$\begin{pmatrix} F_{xi} \\ F_{yi} \end{pmatrix} = k_i^{xy} \begin{pmatrix} \alpha \Delta T(x_i + x_{TC}) \\ \alpha \Delta T(y_i + y_{TC}) \end{pmatrix} \quad (0.7)$$

Now applying force balance in two directions, i.e., $$\sum_i F_{xi} = 0 \text{ and } \sum_i F_{yi} = 0,$$

and simplifying the two simultaneous equations in terms of the unknowns $x_{TC}$ and $y_{TC}$ yields $$x_{TC} \sum_{i=1}^{N} k_{11}(\theta_i) + y_{TC} \sum_{i=1}^{N} k_{12}(\theta_i) + \sum_{i=1}^{N} k_{11}(\theta_i) x_i + \sum_{i=1}^{N} k_{12}(\theta_i) y_i = 0 \quad (0.8)$$

$$x_{TC} \sum_{i=1}^{N} k_{21}(\theta_i) + y_{TC} \sum_{i=1}^{N} k_{22}(\theta_i) + \sum_{i=1}^{N} k_{21}(\theta_i) x_i + \sum_{i=1}^{N} k_{22}(\theta_i) y_i = 0$$

Where $k_{11}(\theta_i)$ and $k_{22}(\theta_i)$ represent the diagonal terms of the stiffness tensor $k_i^{xy}$ and $k_{12}(\theta_i)$ and $k_{21}(\theta_i)$ represent the off-diagonal terms. Rewriting in matrix notation in the form Ax=B for yields $$\underbrace{\begin{pmatrix} \sum_{i=1}^{N} k_{11}(\theta_i) & \sum_{i=1}^{N} k_{12}(\theta_i) \\ \sum_{i=1}^{N} k_{21}(\theta_i) & \sum_{i=1}^{N} k_{22}(\theta_i) \end{pmatrix}}_{A} \underbrace{\begin{pmatrix} x_{TC} \\ y_{TC} \end{pmatrix}}_{x} = \quad (0.9)$$

$$\underbrace{\begin{pmatrix} -\left\{\sum_{i=1}^{N} k_{11}(\theta_i) x_i + \sum_{i=1}^{N} k_{12}(\theta_i) y_i\right\} \\ -\left\{\sum_{i=1}^{N} k_{21}(\theta_i) x_i + \sum_{i=1}^{N} k_{22}(\theta_i) y_i\right\} \end{pmatrix}}_{B}$$

Solution of these equations results in the coordinates for the position of the thermal center $x_{TC}$ and $y_{TC}$ in the same coordinate system in which the locations of the constraints C1, C2, . . . , CN are defined. It can be seen that the location of the thermal center TC is virtually independent of both the change in temperature and the coefficient of expansion as expected. Some coupling may occur for very large changes in temperature. It is a function of the constraint geometry and stiffness to first order. The equations above do not include the rigid body rotation that accompanies any dimensional change in the presence for asymmetry in the constraint stiffness, but this rotation in general is likely to be small for small changes in temperature. The magnitude of rotation is proportional to the temperature change $\Delta T$ and the CTE $\alpha$. This rotation must be taken into account and its effect upon the particular application analyzed to determine the impact. In many practical applications, e.g. athermalization of the location of the optical axis of a rotationally symmetric optical system, these rotations are of no consequence.

The analysis described above may be extended to the three-dimensional case, i.e., for the purposes of controlling the location of the TC in three dimensions. In this case, each constraint has three stiffness components and in general six equations are required to solve for the location of the TC and three rigid body rotations. These equations may be obtained by setting the force balance equations in the three coordinate directions and the moment balance equations about the coordinate axes to zero. The stiffness transformations also now involve three rotations.

The techniques described above can be applied to a mount for an optical encoder head used to monitor changes in the relative position of a wafer stage in a microligthography system based on an encoder scale. Multiple optical encoder systems, including interferometric encoder systems, are disclosed in U.S. Patent Publication No. 2011/0255096 A1 by Leslie L. Deck et al. and entitled "INTERFEROMETRIC ENCODER SYSTEMS," the contents of which are incorporated herein by reference. The thermal performance of an encoder head can be a key performance parameter and the techniques disclosed herein provide a means for controlling thermally induced dimensional changes to achieve desired performance.

Thermal instabilities in the encoder head assembly primarily arise from three sources: optical path length (OPL) changes induced by changes in refractive index of the optics and physical dimensions of the optics, gross motion of the optics and gross motions of the entire optical assemblies that results in changes in the position of the measurement datum. Techniques described in this specification control the thermal instabilities motions arising from the last contributor.

Figure 7:
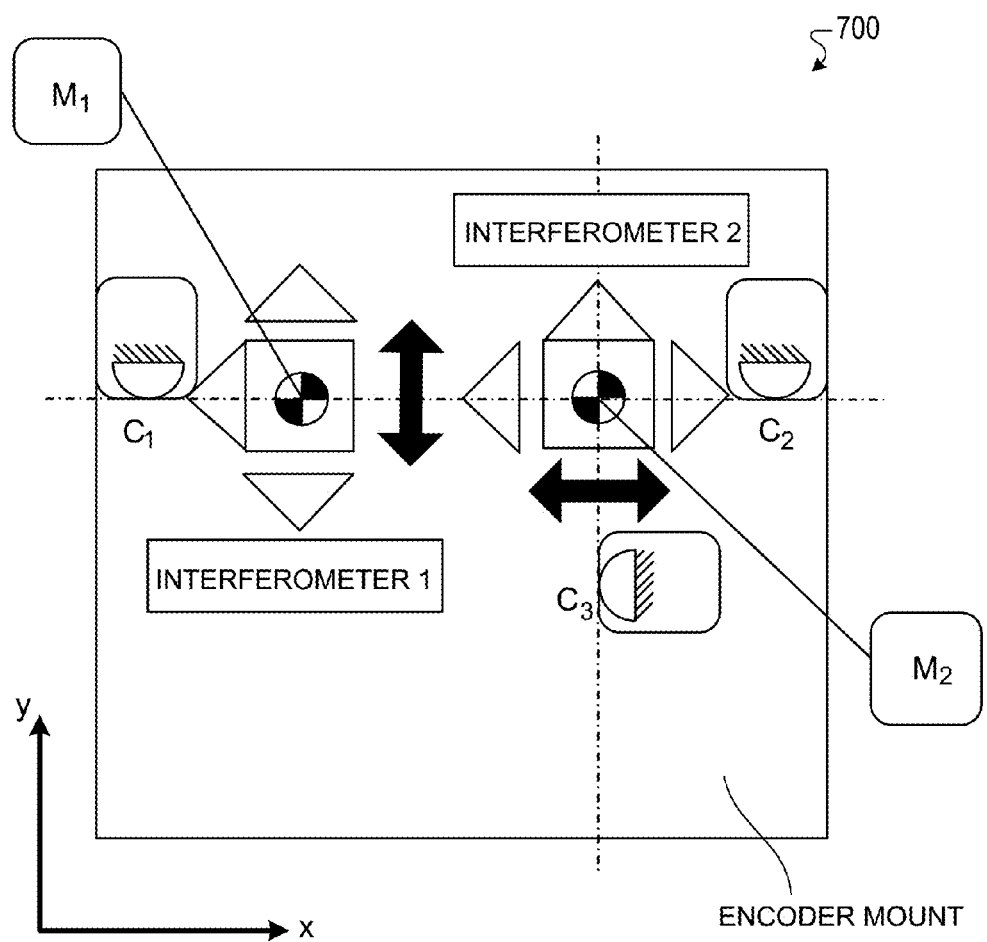
FIG. 7 shows a schematic of measurement points and mount of and encoder head.

FIG. 7 shows a schematic representation of an encoder head assembly 700 (also referred to as an encoder head, head or encoder.) The encoder head 700 includes two interferometer assemblies (interferometer 1 and interferometer 2) that are attached to the encoder mount, which in turn attaches to a structure of a machine in which the encoder 700 is used. In the example illustrated in FIG. 16, the encoder head 700/1826 is used in a lithography tool 1800. In this example, the encoder mount of the encoder head 1826 mechanically couples to a mechanical reference frame of the lithography tool 1800 that includes the encoder scale. For instance, the mechanical reference frame further includes an exposure base 1804 and a mask stage 1816, when the encoder scale is positioned on the mask stage 1816. Alternatively or additionally, the mechanical reference frame further includes the exposure base 1804 and a wafer stage 1822, when the encoder scale (or an additional encoder scale) is positioned on the wafer stage 1822. Referring again to FIG. 7, the head assembly 700 has two measurements datums, $M_1$ and $M_2$, corresponding to Interferometers 1 and 2 that sense displacement in the XZ direction and YZ direction respectively. (The Z-direction is normal to the page.) The Interferometers 1 and 2 are insensitive to displacements in the remaining orthogonal in-plane directions, e.g., Interferometer 1 is insensitive to displacements in the Y direction, and Interferometer 2 is insensitive in to displacements in the X direction. In general, the mount design preferably satisfies several requirements simultaneously.

A first requirement for head assembly 700 relates to controlling the motions of the measurement datums $M_1$ and $M_2$ relative to a fixed datum on a machine frame in the respective sensitive directions. For example, motion should be controlled in the X and Y directions for $M_1$ and $M_2$ respectively. The noted machine frame, also referred to as a mechanical reference frame, is part of a machine in which the head assembly 700 is used.

A second requirement relates to minimizing or accommodating the thermally induced strain between the mount and the optics within. This may be important with respect to minimizing motion of the optics relative to the mount and OPL changes due to stress induced index changes, stability and maintenance of the integrity of bond lines, etc.

A third requirement relates to minimizing or accommodating relative thermal strain between the mount and the machine frame (also referred to as the mechanical reference frame) to which the device is mounted. This may be critical to preventing the buildup of large stresses and consequent deformation of the mount as well as non-deterministic motions of the mount.

A fourth requirement relates to minimizing the gross motions of the various optical elements. This may be a secondary consideration in this application due to the unique measurement principle which rejects common mode motions of the optics that are characteristic of thermal expansion for measurements of displacement in the X and Y direction (as disclosed in U.S. Patent Publication No. 2011/0255096, by Deck et al, the contents of which are incorporated herein by reference.) This situation does not apply in the out-of-plane (Z) direction.

A fifth requirement relates to providing a mount with adequate stiffness to meet the dynamic performance requirements.

In some implementations, the required control of the measurement points M1 and M2 is addressed by locating the measurements points M1 and M2 at locations that are invariant under temperature change, in conjunction with the unidirectional in-plane sensitivity of Interferometers 1 and 2 (indicated by the double-headed arrows in FIG. 7.) This is achieved by a predetermined arrangement the constraints C1, C2 and C3, e.g., the connections between the encoder mount and the machine frame (also referred to as the mechanical reference frame), one possible arrangement of which is shown in FIG. 7. The constraints C1, C2 and C3 are depicted as half-circles with the hatching along the straight edge representing the attachment of the constraint to "ground" which is the machine frame in this case. The constraints C1, C2 and C3 may be thought of anti-friction bearing assemblies which contact the assembly within notional cutouts at the points shown. These constraints C1, C2 and C3 have high normal stiffness at the points of contact and virtually zero stiffness and friction in the tangential direction, i.e., no resisting force is developed at the points of contact in the tangential direction during expansion.

Figure 8:
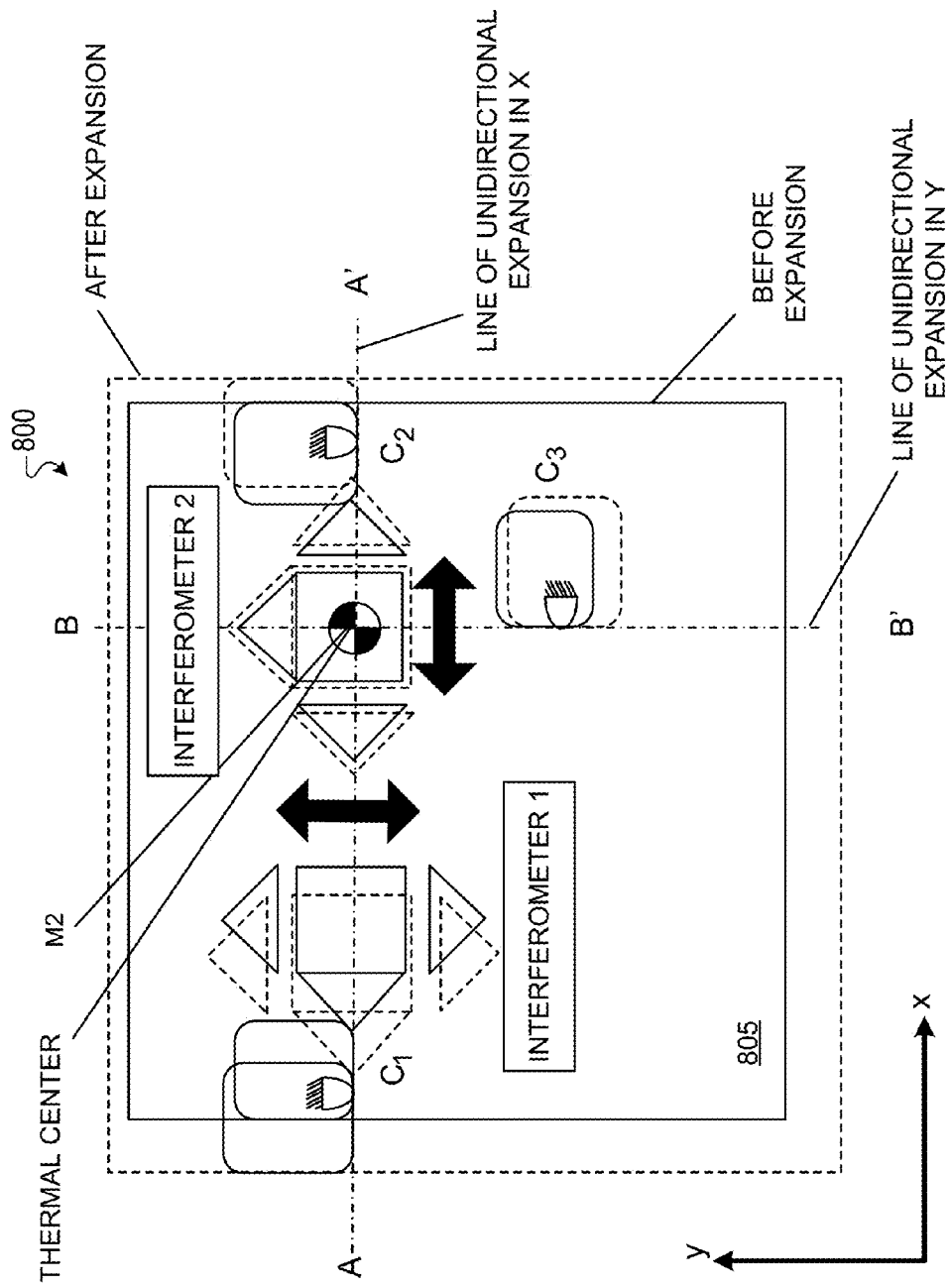
FIG. 8 shows a thermal center of a thermally deformed assembly.

FIG. 8 depicts the behavior of an encoder head assembly 800 under thermal dilatation. As shown in FIG. 8, there is one point on the encoder mount 805 that is invariant under dilatation. This point is referred to as the thermal center (TC) and is chosen to coincide with the measurement point $M_2$, thereby virtually eliminating the thermal sensitivity of this point to in-plane motions under thermal dilatation. As further shown in FIG. 8, in addition to the TC, there are two lines of unidirectional invariance which are also determined by the geometry of constraints C1, C2 and C3. These are represented by the lines AA' and BB' along which expansion is unidirectional and occurs along the respective X and Y directions only. The required thermal insensitivity in the Y direction of the other measurement point $M_1$ is achieved by arranging for the line AA' to pass through this point. As a result Interferometer 1 experiences virtually no motion along its sensitive direction, the thermally induced motions being restricted to a direction coinciding with its insensitive direction.

The techniques disclosed above can be applied in the absence of unbalanced change in the tangential forces at the points of constraint induced due to the thermal deformation. The tangential forces stem from friction or tangential stiffness at the constraints C1, C2 and C3. In the presence of unbalanced forces, rigid body motions of the body are required to equalize the forces and achieve static equilibrium, which effectively changes the location of the thermal center as is described below.

The first and third of the requirements described above can drive the design towards one that results in unbalanced forces and a consequent shift in the thermal center from the desired location. This situation arises from the need to accommodate differential thermal expansion at the various interfaces as described below. The first interface at which differential expansion must be accounted for is between the mount 805 and the optics. This is accommodated by choosing the material of the mount 805 such that the CTE mismatch between the mount 805 and the optical components is minimized. This is achieved through a choice of a titanium alloy (e.g., Ti6A14V) with a CTE of 8.5-9 ppm/K to match the CTE of the BK7 optics of ~8.4 ppm/K. The third of the requirements described above is addressed by providing a means of accommodating the relative strain rather than eliminating the relative strain. This is necessitated by the fact that an alumina machine frame has a CTE of ~5.4 ppm/K, which is significantly different from that of the titanium. The accommodation is achieved by means of strategically located flexural elements that provide the constraint in the required direction while simultaneously providing the compliance required to accommodate the differential thermally induced dimension changes and doing so in a manner that eliminates the non-deterministic behavior of friction at a sliding interface.

Figure 9:
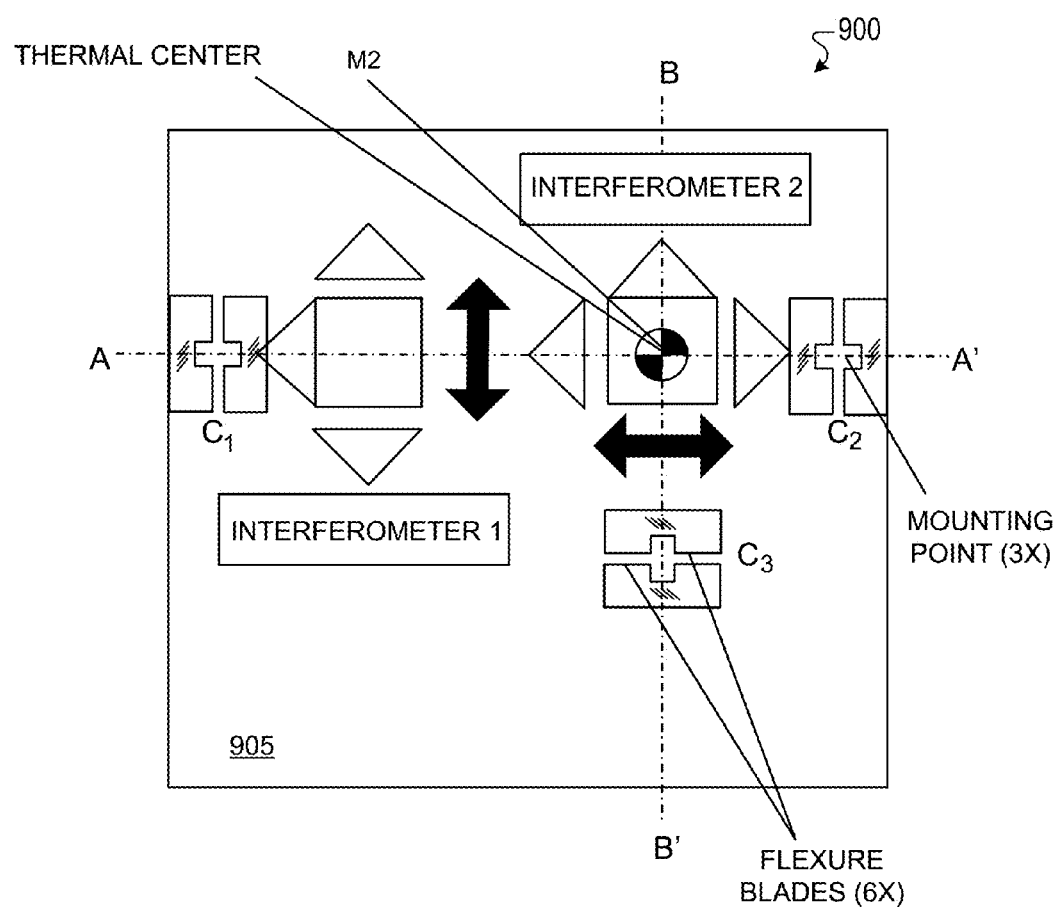
FIG. 9 shows a flexure equivalent of a constraint pattern corresponding to FIG. 8.

FIG. 9 shows a flexure equivalent of the constraint pattern for an encoder head assembly 900. This equivalency is based on the notion that a rolling element constraint has a very high stiffness in the normal direction at the point of contact with the mount 905 and zero or very low stiffness in the direction perpendicular to the normal. The flexure blades C1, C2 and C3 depicted in FIG. 9 are arranged so as to have a high stiffness in the constraint direction which coincides with the plane of the blades C1, C2 and C3 and relatively low stiffness in the direction perpendicular to the blades C1, C2 and C3. Also, much like the rolling element constraints, this arrangement of flexures C1, C2 and C3 also allows for small in-plane rotations and out-of-plane rotations to a lesser extent. In summary, for small deflections, the flexures C1, C2 and C3 offer the same constraints and degrees-of-freedom as the rolling element or sliding contact, albeit with different force characteristic.

Figure 10:
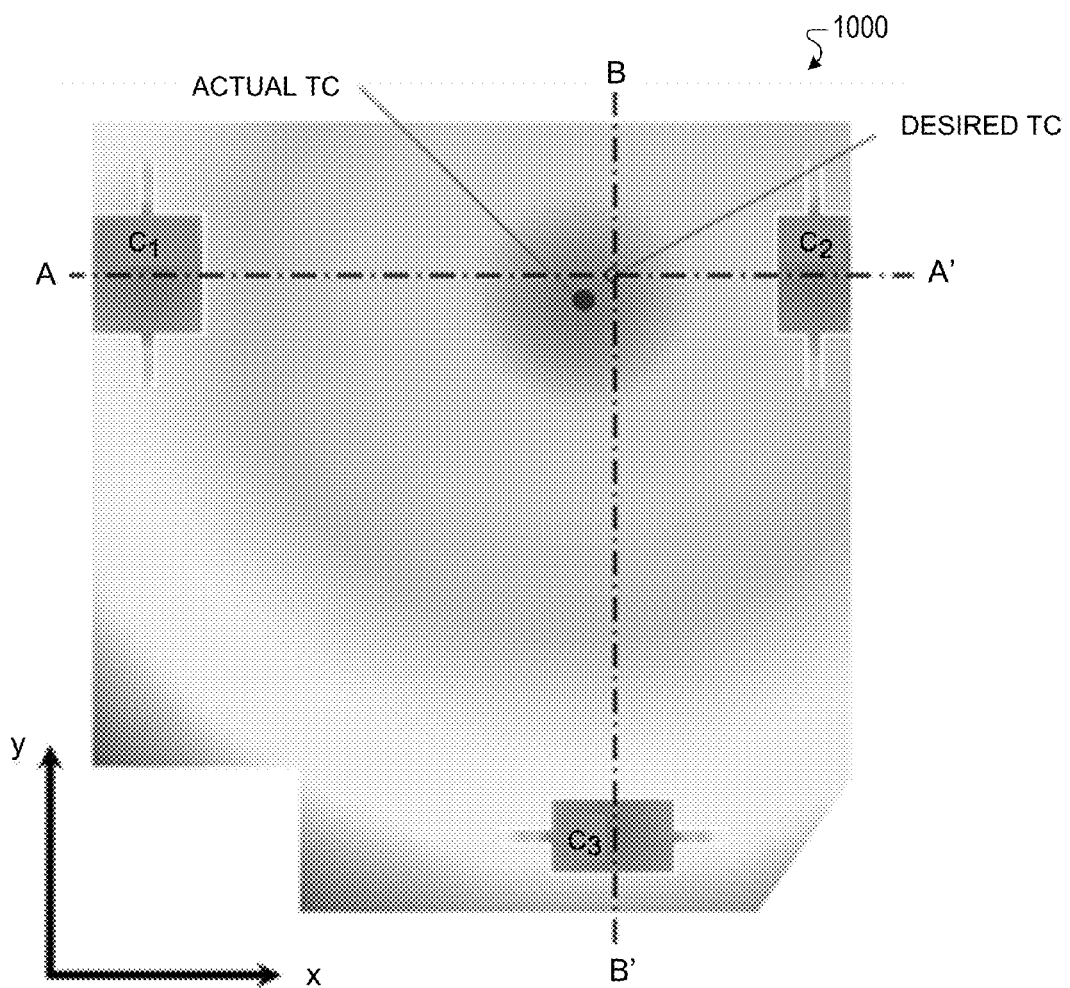
FIG. 10 shows a plot of displacement field showing displacement of TC for constraints of equal stiffness.

However, the choice to use of flexural elements now opens the door to constraints with finite stiffness in the tangential direction (perpendicular to direction of constraint) and the possibility of an undesirable shift in the location of the thermal center. FIG. 10 shows that this expectation is realized. The plot 1000 of the displacement field corresponds to a simplified finite element analysis of the constraint pattern of the encoder 900 where all the constraint stiffnesses are assumed to be equal. The displacement of the thermal center (Actual TC) from the location dictated by the geometry of the constraints (Desired TC) is visible in the expanded view of the vector plot 1000 in the vicinity of the (Actual) thermal center. It is evident that the (Actual) thermal center has shifted in both X and Y directions. The primary contribution to motion in the X direction is due to a rigid body rotation about constraint C3. In other words, the primary cause of this motion is the moment produced about C3 due an unbalanced force that acts along AA'. The unbalanced force in-turn results from the unequal deformation of the flexures of C1 and C2 along the X direction. The thermal deformation is proportional to the length and since the lengths from the location of the thermal center enforced by the geometry, i.e., line BB' to the locations of C1 and C2 along AA' are unequal, a force imbalance results which causes the mount 905 to rotate until the forces achieve equilibrium. As a consequence, the (Actual) thermal center moves in the X direction. Any method that equalizes the forces can prevent this shift. The shift in the Y direction from the position dictated by the geometry occurs for a similar reason.

This unbalanced change in force can be prevented in several ways. In some implementations, the contacts are arranged to have "zero" tangential stiffness thereby preventing any change in force. This situation may be closely approximated by a constraint with a rolling element as described above. This is however not always practical, especially in the encoder head applications 700, 800, 900. In other implementations, the constraints are disposed with finite and equal tangential stiffness symmetrically about the thermal center. This results in a balanced change in the forces on the body thereby preventing a rigid body motion and a consequent shift in the thermal center. For example, unbalanced forces acting along AA' can be eliminated by disposing constraints C1 and C2 symmetrically about BB'. This is an option that is precluded by the location of other components and the overall allowed envelope of the systems 700, 800, 900.

In some other implementations, the stiffnesses of the constraints are adjusted to produce a zero net change in force. This can include the introduction of additional elements to produce compensating forces. This strategy can be used in embodiments of the thermally stable encoder head, for instance. In yet some other implementations, the geometry of the constraints is adjusted to pre-compensate for the shift in the thermal center. In other words, the constraints are intentionally misplaced relative to the ideal geometry to produce the desired invariance. This strategy may not be used in design of sensor mounts when the locations of the constraints had been pre-determined to meet specified interface requirements. Moreover, the unbalanced change in force can be prevented by using combinations of the two aforementioned implementations.

Figure 11:
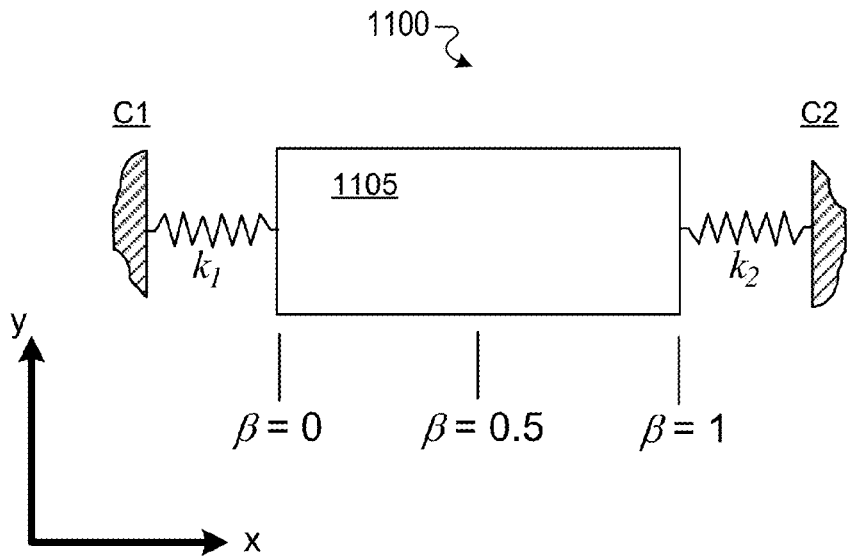
FIG. 11 shows a rigid body supported by two compliant constraints.

FIG. 11 shows a diagram 1100 of a rectangular rigid body 1105 constrained at the two ends by elastic supports. The diagram 1100 is used to illustrate techniques of selecting appropriate stiffnesses for the constraints C1 and C2. In this example, the elastic supports are depicted as springs. For the purposes of this example, the stiffness of the constraints C1 and C2 in the Y direction is assumed to be the same for both supports and may be assumed to be zero for now. However, this stiffness would likely be high to provide constraint in this direction. This stiffness may be ignored for the time being as it does not have a component in the X direction by definition. The purpose of the compliance in the horizontal X direction is to provide a means to accommodate the thermally induced dimensional changes of the rigid body 1105. From symmetry arguments, it is easy to see that if the stiffness $k_1$ and $k_2$ are equal, then the point on the body 1105 that remains invariant in the direction along the long axis is midway between the two supports, because the thermal center coincides with the geometric center.

Figure 12:
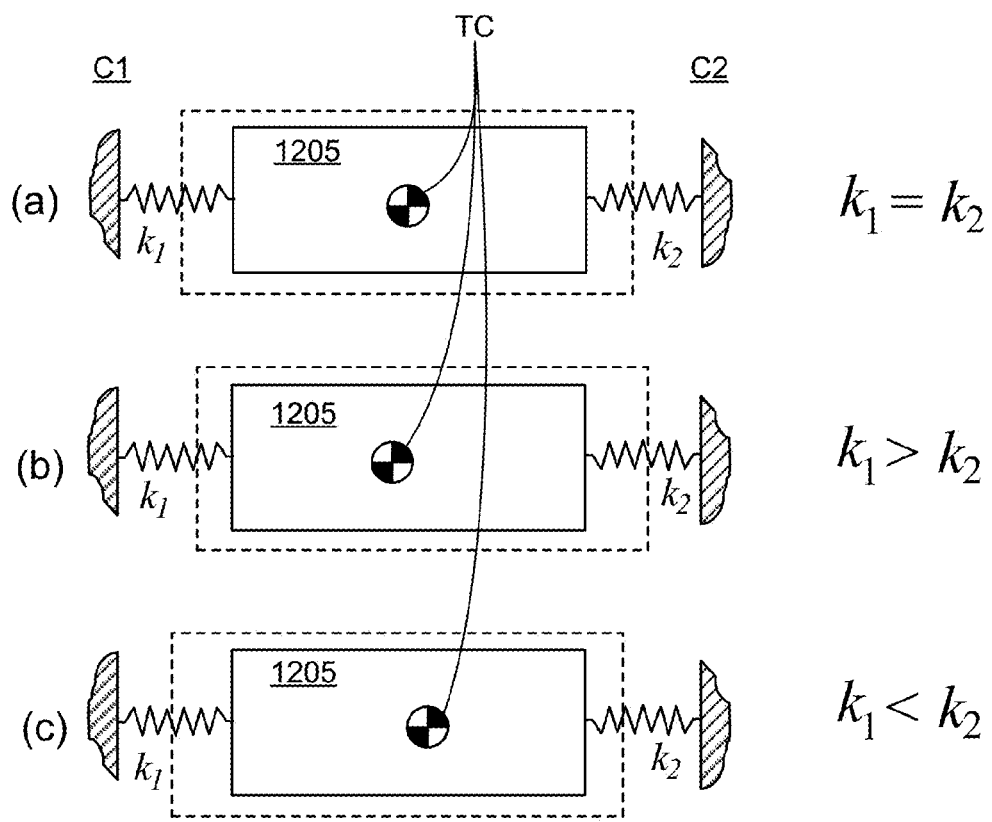
FIGS. 12A-12C illustrate the influence of constraint compliance on location of thermal center.

As shown in FIG. 12A, expansion results in a change in the dimensions of the constrained body 1205, but there is no net rigid body motion of the body 1205. If on the other hand, the stiffnesses are unequal, as shown in FIGS. 12B-12C, then a rigid body motion results which cancels the motion due to the dimension change at one location between the constraints C1 and C2 rendering that location invariant under thermally induced dimension changes. Cancellation of the thermal expansion by the rigid body motion can be used to create a point that is invariant relative to a reference frame external to the body.

Figure 13:
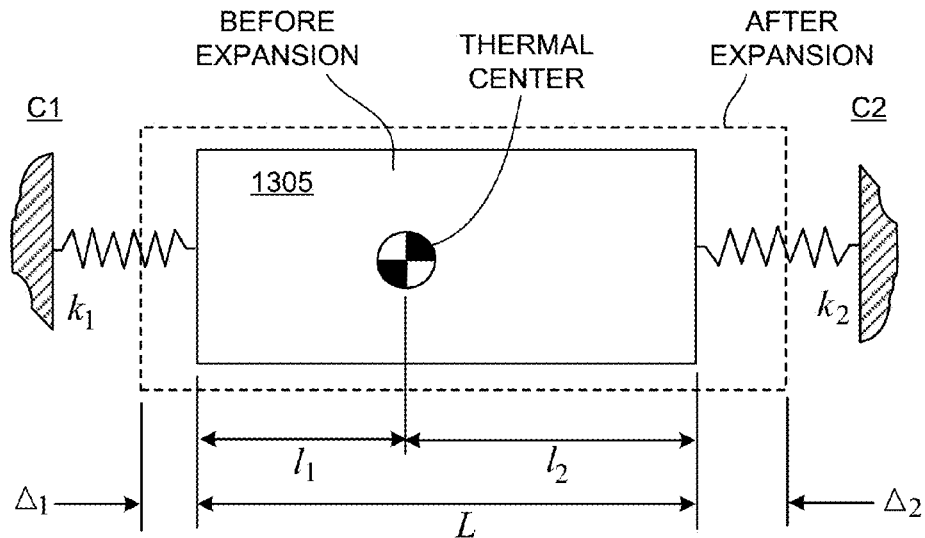
FIG. 13 shows parameters for deriving TC location in terms of constraint stiffness.

An expression for the normalized (or parametric) location $\beta$ of the thermal center may be derived from a force balance equation. As shown in FIG. 11, the value of the parameter $\beta$ ranges from 0 to 1, the extreme values corresponding to the locations of the constraints C1 and C2 at either end of the body 1105. A thermal center location midway between the constraints C1 and C2, i.e., at the geometric center would correspond to $\beta=0.5$. The expression for $\beta$ in terms of the stiffness of the two constraints $k_1$ and $k_2$ may be derived with reference to FIG. 13. Let the thermal center be located some distance $l_1$ from the constraint C1 with stiffness $k_1$. Then based on the definition of $\beta$, $l_1$ is given by $$l_1 = \beta L \quad (0.10)$$

and $$l_2 = (1-\beta)L \quad (0.11),$$

where L is the length of the body 1305 and $l_2$ is the distance of the thermal center from the constraint C2 with stiffness $k_2$. Further, assume that the body 1305 is made up of a material with a CTE $\alpha$ and undergoes a temperature change $\alpha T$. The change in temperature and the CTE are assumed to be positive in this example.

Referring again to FIG. 13 and noting that in general the two constraints C1 and C2 deform by $\Delta_1$ and $\Delta_2$, and generate forces $F_1$ and $F_2$ which are given by $$F_1 = k_1 \Delta_1 = k_1 \alpha l_1 \Delta T = k_1 \alpha \Delta T \beta L$$

$$F_2 = k_2 \Delta_2 = k_2 \alpha l_2 \Delta T = k_2 \alpha \Delta T (1-\beta) L \quad (0.12)$$

Static equilibrium requires that $F_1 = F_2$. Equating the expressions for the forces from (0.12) and solving for $\beta$ results in $$\beta = \frac{k_2}{k_1 + k_2} \quad (0.13)$$

Dividing the numerator and denominator by $k_1$ results in an expression in terms of the ratio of the stiffnesses $\gamma = k_2/k_1$ that is given by $$\beta = \frac{\gamma}{1+\gamma} \quad (0.14)$$

Figure 14:
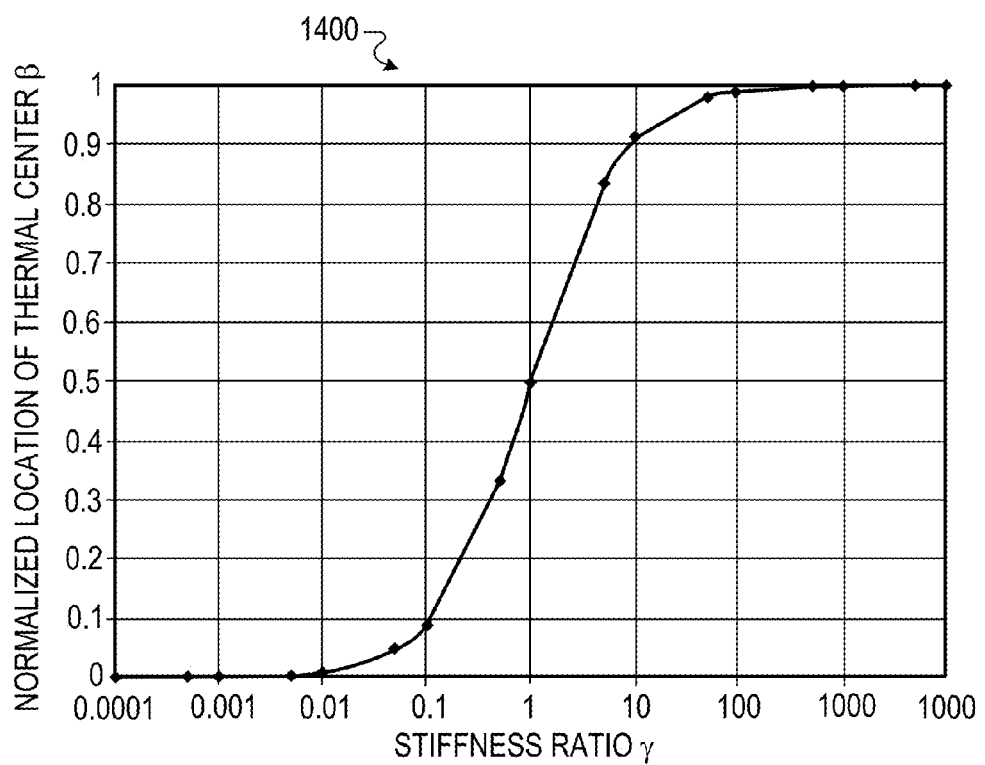
FIG. 14 shows dependence of normalized TC location on the stiffness ratio.

The results of limit testing of Equation (0.14) are summarized in Table 1 and a plot 1400 of $\beta$ as a function of the stiffness ratio $\gamma$ is shown in FIG. 14.

Note that the location of the thermal center moves toward the dominant constraint and asymptotically approaches the location of that constraint as the stiffness ratio approaches extreme values. This is in keeping with physical intuition in that if one of the constraints is infinitely stiff, then the point about which expansion occurs will take place at the location of the constraint and all the dimensional change will be accommodated by the more compliant constraint.

TABLE 1

Limit case testing of Equation (0.14)

| Case | $\gamma = k_2/k_1$ | $\beta$ |
|---|---|---|
| $k_1 \to \infty$ | $\gamma \to 0$ | 0 |
| $k_2 \to \infty$ | $\gamma \to \infty$ | 1 |
| $k_1 = k_2$ | 1 | 0.5 |

Note that Equation (0.14) is independent of both the change in temperature (as is required for the thermal center) and also the CTE of the material. It is purely a function of the ratio of the stiffnesses. This last attribute cannot be overemphasized as it provides enormous design freedom especially in design scenarios with multiple objectives. For example, the dynamic performance (resonance frequency) of the system in the X direction is dependent on the absolute value of the stiffnesses (for a given mass) while the thermal center location is dependent on the ratio, thus making it possible to achieve multiple objectives simultaneously.

This strategy has been used to advantage to position the thermal center at the desired location in the encoder head in two different ways. The translation of the TC in the X direction has been largely achieved by increasing the flexure blade thickness of C2 as is evident when comparing the plots of displacement field 1000 and 1500 in respective FIGS. 10 and 15. In both FIGS. 10 and 15, the controlling stiffnesses (corresponding to the stiffnesses $k_1$ and $k_2$ in the simple model described above in connection with FIGS. 11-13) are the stiffnesses in the X direction of the C1 and C2 constraints. The increase in stiffness results in the motion of the TC towards the stiffer flexure as indicated in panel (b) of FIG. 12. In this manner, the TC is moved in the positive X direction in FIGS. 10 and 15 by increasing the stiffness of C2 or decreasing the stiffness of C1.

The adjustment of the location of the TC in the Y direction is somewhat more involved. In this case, the controlling stiffnesses are the net stiffness of C1 and C2 in the Y direction at one end of the rigid body and the Y direction stiffness of C3 at the other. In principle, the Y location should coincide with the line AA' as this is the line that joins constraints C1 and C2 (as shown in FIG. 8, for instance.) However, due to the finite stiffness of C3 along BB' and the relatively large deformation of C3 during a temperature induced dimensional change (due to the relatively long "throw" between line AA' and C3), a significant unbalanced force is generated that results in motion of the TC in the Y direction due to the finite (high though not infinite) stiffness of C1 and C2 flexures in the Y direction. In contrast to the previous situation where the TC was not close to either of the compliant members (in the X direction) with a $\beta$ of 0.3 or 0.7 (depending on the coordinate system adopted), the requirement in this case is to place the TC right at one of the elastic constraints in the Y direction, e.g., along the AA' line, corresponding to a $\beta$ value of very nearly to 0 or 1 (again depending on the coordinate system adopted). Examination of FIG. 14 shows that this corresponds to the flat regions of the curve 1400 where even large changes in the stiffness ratio $\gamma$ do not produce significant changes in $\beta$. In other words, increasing the Y direction stiffness of C1 and C2 or decreasing the Y direction of C3 even substantially has very little impact on the position of the TC.

Figure 15:
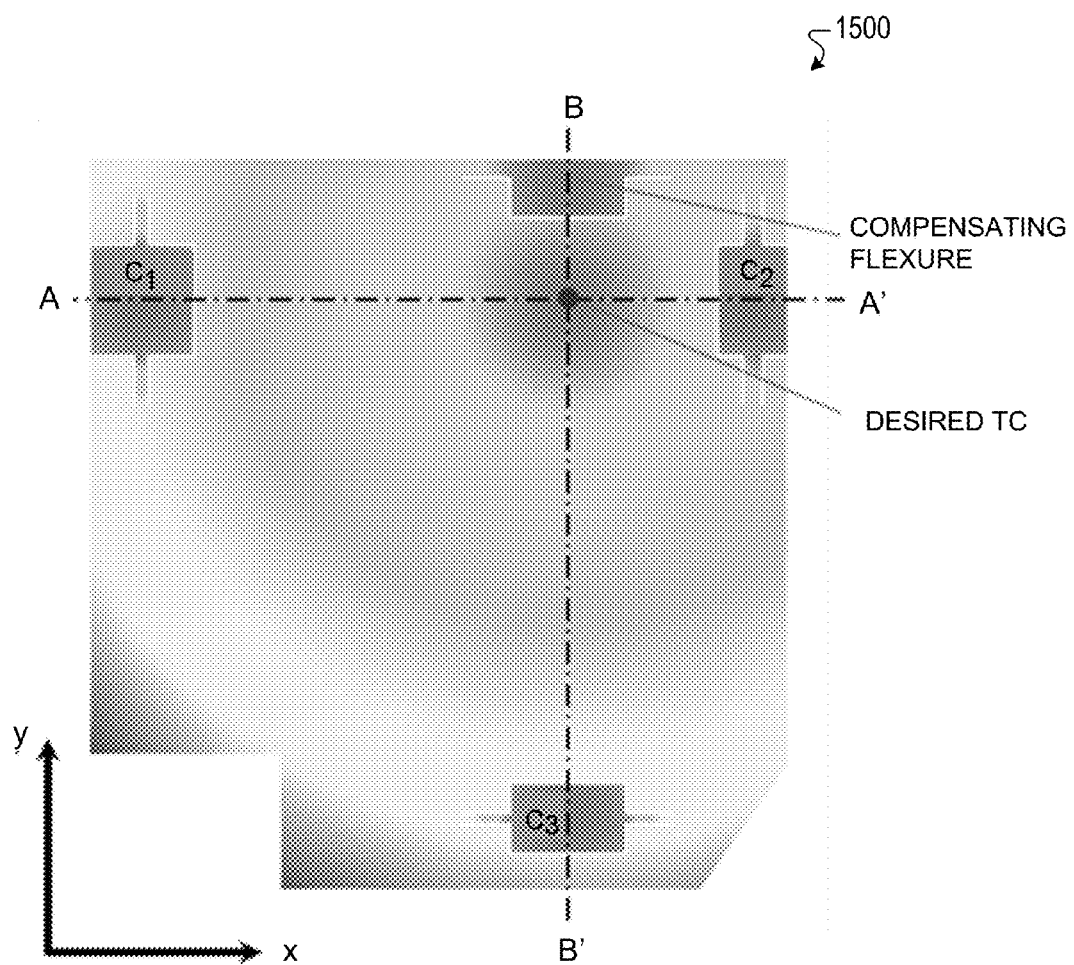
FIG. 15 shows location of TC after tuning of flexures and addition of compensating flexure.

An alternate approach is required and the approach taken here is to place the desired location of the TC at a favorable value of $\beta$ (0.17 or 0.83) by introducing an additional compensating flexure above the line AA' as shown in FIG. 15. This value of $\beta$ is in the region of the graph with a significant non-zero slope, thereby providing the required sensitivity to effect the required change. Another way to view the action of this compensating flexure is to view it as a device that provides a compensating force to cancel the unbalanced force generated by the deflection of C3.

Although, the description herein describes the manipulation of the location of the thermal center in a two-dimensional plane, the same principles can be extended into three-dimensions in a straightforward fashion. Further, although the stiffness manipulation described herein is based on adjusting the stiffness of constraints composed of compliant members by changing their dimensions (such as by using a flexure blade), other mechanisms of stiffness control can also be envisaged. For example, the contact stiffness of Hertzian contacts may be adjusted by manipulating the preload, stiffnesses of compliant elements may be adjusted by varying axial loads, changing the boundary conditions (clamping, load locations, materials), exploiting the thermal dependence of the modulus of elasticity, etc.)

Lithography Tool Applications

As noted previously, the techniques disclosed herein can be used to for mounting of one or more encoder heads in, for example, a lithography tool. Lithography tools are especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the metrology system used to position the wafer and reticle (or mask) stages. Since a lithography tool may produce $50-100M/year of product, the economic value from improved metrology systems is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer. In certain lithography tools, e.g., lithography scanners, the mask is also positioned on a translatable stage that is moved in concert with the wafer during exposure.

Encoder systems, such as those discussed previously, are important components of the positioning mechanisms that control the position of the wafer and reticle, and register the reticle image on the wafer. If such encoder systems include the features described above, the accuracy of distances measured by the systems can be increased and/or maintained over longer periods without offline maintenance, resulting in higher throughput due to increased yields and less tool downtime.

In general, the lithography tool, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 998), the contents of which is incorporated herein by reference.

Encoder systems described above can be used to precisely measure the positions of each of the wafer stage and mask stage relative to other components of the exposure system, such as the lens assembly, radiation source, or support structure. In such cases, the encoder system's optical assembly can be attached to a stationary structure and the encoder scale attached to a movable element such as one of the mask and wafer stages. Alternatively, the situation can be reversed, with the optical assembly attached to a movable object and the encoder scale attached to a stationary object.

More generally, such encoder systems can be used to measure the position of any one component of the exposure system relative to any other component of the exposure system, in which the optical assembly is attached to, or supported by, one of the components and the encoder scale is attached, or is supported by the other of the components.

Figure 16:
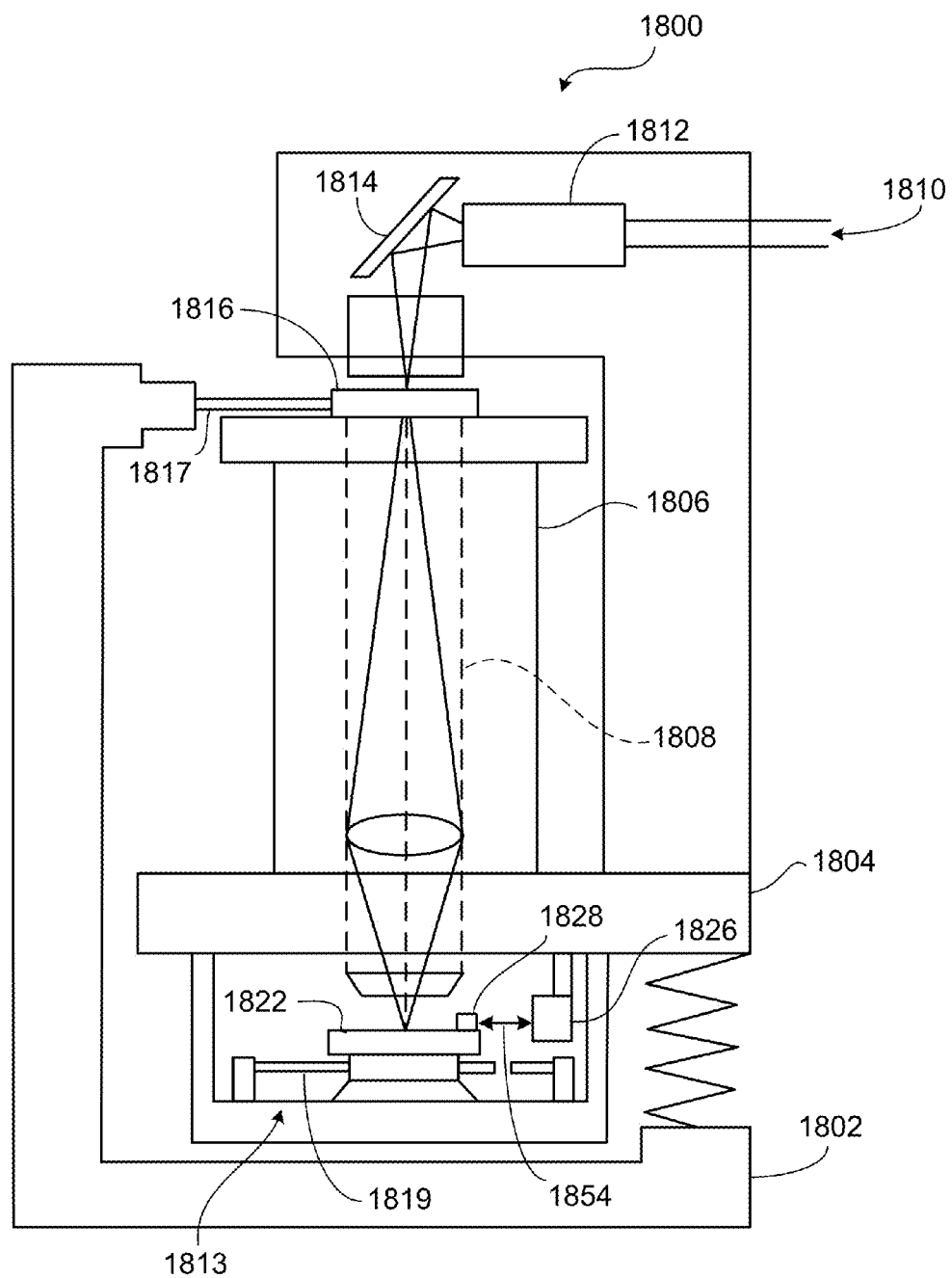
FIG. 16 is a schematic diagram of an embodiment of a lithography tool that includes an interferometer.

An example of a lithography tool 1800 using an interferometry system 1826 is shown in FIG. 16. The encoder system is used to precisely measure the position of a wafer (not shown) within an exposure system. Here, stage 1822 is used to position and support the wafer relative to an exposure station. Scanner 1800 includes a frame 1802, which carries other support structures and various components carried on those structures. An exposure base 1804 has mounted on top of it a lens housing 1806 atop of which is mounted a reticle or mask stage 1816, which is used to support a reticle or mask. A positioning system for positioning the mask relative to the exposure station is indicated schematically by element 1817. Positioning system 1817 can include, e.g., piezoelectric transducer elements and corresponding control electronics. Although, it is not included in this described embodiment, one or more of the encoder systems described above can also be used to precisely measure the position of the mask stage as well as other moveable elements whose position must be accurately monitored in processes for fabricating lithographic structures (see supra Sheats and Smith Microlithography: *Science and Technology*).

Suspended below exposure base 1804 is a support base 1813 that carries wafer stage 1822. Stage 1822 includes a measurement object 1828 for diffracting a measurement beam 1854 directed to the stage by optical assembly 1826. A positioning system for positioning stage 1822 relative to optical assembly 1826 is indicated schematically by element 1819. Positioning system 1819 can include, e.g., piezoelectric transducer elements and corresponding control electronics. The measurement object diffracts the measurement beam reflects back to the optical assembly, which is mounted on exposure base 1104. The encoder system can be any of the embodiments described previously.

During operation, a radiation beam 1810, e.g., an ultraviolet (UV) beam from a UV laser (not shown), passes through a beam shaping optics assembly 1812 and travels downward after reflecting from mirror 1814. Thereafter, the radiation beam passes through a mask (not shown) carried by mask stage 1816. The mask (not shown) is imaged onto a wafer (not shown) on wafer stage 1822 via a lens assembly 1808 carried in a lens housing 1806. Base 1804 and the various components supported by it are isolated from environmental vibrations by a damping system depicted by spring 1820.

In some embodiments, one or more of the encoder systems described previously can be used to measure displacement along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In certain embodiments, the optical assembly 1826 can be positioned to measure changes in the position of reticle (or mask) stage 1816 or other movable components of the scanner system. Finally, the encoder systems can be used in a similar fashion with lithography systems involving steppers, in addition to, or rather than, scanners.

Figure 17A:
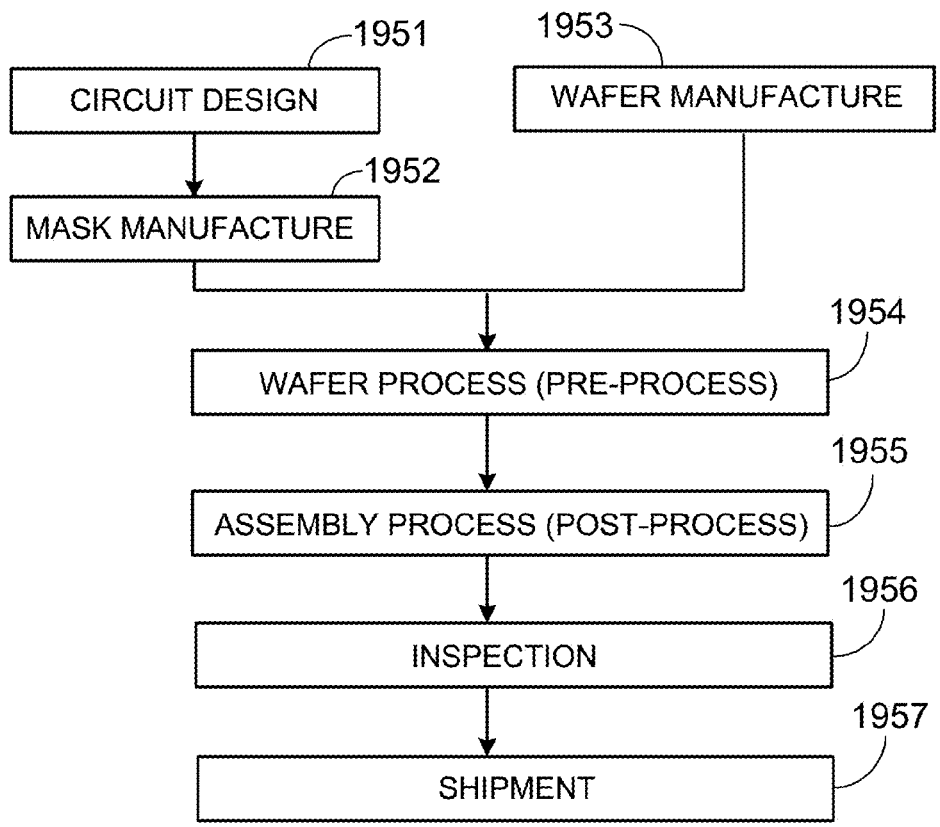
FIG. 17A and FIG. 17B are flow charts that describe steps for making integrated circuits.

As is well known in the art, lithography is a critical part of manufacturing methods for making semiconducting devices. For example, U.S. Pat. No. 5,483,343 outlines steps for such manufacturing methods. These steps are described below with reference to FIGS. 17A and 17B. FIG. 17A is a flow chart of the sequence of manufacturing a semiconductor device such as a semiconductor chip (e.g., IC or LSI), a liquid crystal panel or a CCD. Step 1951 is a design process for designing the circuit of a semiconductor device. Step 1952 is a process for manufacturing a mask on the basis of the circuit pattern design. Step 1953 is a process for manufacturing a wafer by using a material such as silicon.

Step 1954 is a wafer process that is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1955 is an assembling step, which is called a post-process wherein the wafer processed by step 1954 is formed into semiconductor chips. This step includes assembling (dicing and bonding) and packaging (chip sealing). Step 1956 is an inspection step wherein operability check, durability check and so on of the semiconductor devices produced by step 1955 are carried out. With these processes, semiconductor devices are finished and they are shipped (step 1957).

Figure 17B:
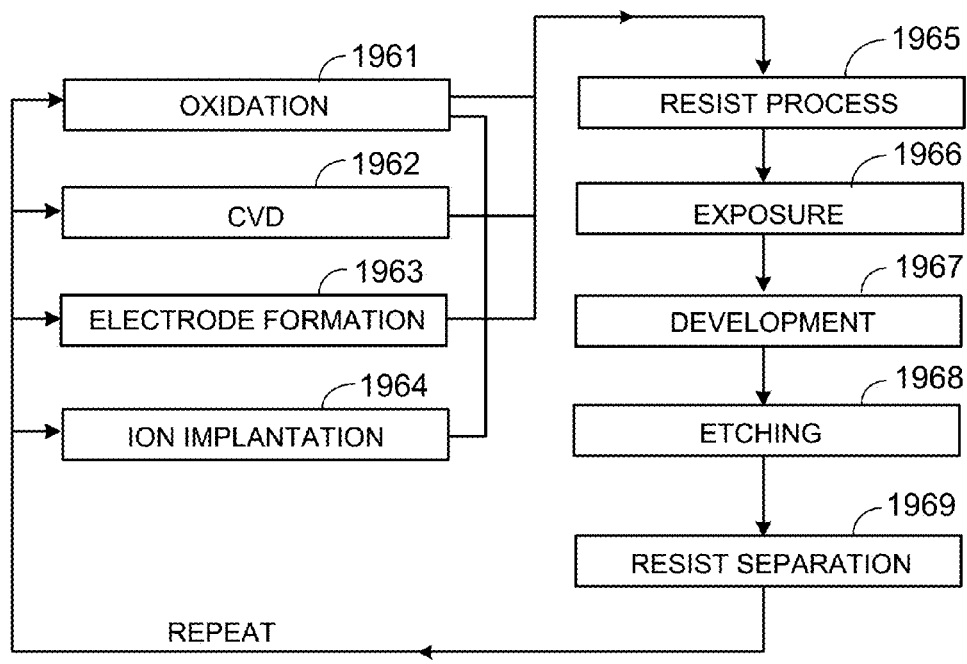

FIG. 17B is a flow chart showing details of the wafer process. Step 1961 is an oxidation process for oxidizing the surface of a wafer. Step 1962 is a CVD process for forming an insulating film on the wafer surface. Step 1963 is an electrode forming process for forming electrodes on the wafer by vapor deposition. Step 1964 is an ion implanting process for implanting ions to the wafer. Step 1965 is a resist process for applying a resist (photosensitive material) to the wafer. Step 1966 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1967 is a developing process for developing the exposed wafer. Step 1968 is an etching process for removing portions other than the developed resist image. Step 1969 is a resist separation process for separating the resist material remaining on the wafer after being subjected to the etching process. By repeating these processes, circuit patterns are formed and superimposed on the wafer.

Encoder systems mounted in accordance with the techniques described above can also be used in other applications in which the relative position of an object needs to be measured precisely. For example, in applications in which a write beam such as a laser, x-ray, ion, or electron beam, marks a pattern onto a substrate as either the substrate or beam moves, the encoder systems can be used to measure the relative movement between the substrate and write beam.

Other embodiments are also within the scope of the following claims.

What is claimed is:

1. An apparatus comprising:
a mechanical reference frame;
a rigid object mechanically coupled to the mechanical reference frame by two or more constraints; and
a first measurement probe supported by the rigid object, the first measurement probe having a first measurement probe datum on the rigid object,
wherein stiffnesses of at least two of the constraints are different from one another, the different stiffnesses being configured to cause a position of a thermal center of the rigid object to align with the first measurement probe datum,
wherein relative locations and the stiffnesses of the constraints cause the first measurement probe datum on the rigid object to remain stationary with respect to the mechanical reference frame during thermal expansion of the rigid object over a range of temperatures,
wherein a first constraint and a second constraint from among the two or more constrains are located on a first line of unidirectional expansion that passes through the thermal center, the first constraint and the second constraint being spaced apart from each other by a first constraint distance and separated from each other by the thermal center, the first constraint having a first radial stiffness $k_{R1}$ along the first line of unidirectional expansion and the second constraint having a second radial stiffness $k_{R2}$ along the first line of unidirectional expansion, where $k_{R1} \neq k_{R2}$, and
wherein a first ratio $\beta_{12}$ of a first distance from the first constraint to the thermal center and the first constraint distance is $\beta_{12} = 1/(1+(k_{R1}/k_{R2}))$, and the first measurement probe datum is located on the rigid object at the thermal center.

2. The apparatus of claim 1, wherein the measurement probe is an optical encoder head and the mechanical reference frame comprises an encoder scale.

3. The apparatus of claim 2, wherein the optical encoder head is an interferometric encoder head.

4. The apparatus of claim 2, wherein the optical encoder head is configured to optically monitor changes in position of the mechanical reference frame relative to the first measurement probe datum.

5. The apparatus of claim 4, wherein the optical encoder head is configured to optically monitor changes in position of the mechanical reference frame along each of multiple degrees of freedom.

6. The apparatus of claim 1, wherein the two or more constraints comprise three or more constraints.

7. The apparatus of claim 1, wherein the stiffness of each constraint quantifies a degree of compliance of the constraint along each of multiple directions.

8. The apparatus of claim 1, wherein the constraints comprise flexures.

9. The apparatus of claim 8, wherein the flexures comprise flexure blades having a higher stiffness in a constraint direction coinciding with the blade and a lower stiffness in a constraint direction perpendicular to the blade.

10. The apparatus of claim 1, wherein the constraints comprise a combination of solid contacts and flexures.

11. The apparatus of claim 1, wherein
a third constraint from among the two or more constraints is located on a second line of unidirectional expansion that orthogonally intersects the first line of unidirectional expansion at the thermal center, the third constraint comprising an anti-friction bearing assembly, and
the apparatus further comprises a second measurement probe supported by the rigid object, the second measurement probe having a second measurement probe datum located on the rigid object on the first line of unidirectional expansion.

12. The apparatus of claim 1, wherein
a third constraint and a fourth constraint from among the two or more constraints are located on a second line of unidirectional expansion that orthogonally intersects the first line of unidirectional expansion at the thermal center, the third constraint and the fourth constraint being spaced apart from each other by a second constraint distance and separated from each other by the thermal center, the third constraint having a third radial stiffness $k_{R3}$ along the second line of unidirectional expansion and the fourth constraint having a fourth radial stiffness $k_{R4}$ along the second line of unidirectional expansion, where $k_{R3} \neq k_{R4}$,
a second ratio $\beta_{34}$ of a second distance from the third constraint to the thermal center and the second constraint distance is $$\beta_{34}=1/(1+(k_{R3}/k_{R4})), \text{ and}$$

the apparatus further comprises a second measurement probe supported by the rigid object, the second measurement probe having a second measurement probe datum located on the rigid object on the first line of unidirectional expansion.

13. A lithography system comprising:
a projection objective for imaging a mask at an object plane to an image plane;
a mechanical reference frame comprising (i) a stage for positioning the mask at the object plane, and (ii) an encoder scale supported on the stage;
a first encoder head positioned to direct light to and receive light from the encoder scale along a first direction; and
a mount mechanically coupled to the mechanical reference frame by a plurality of constraints, the mount supporting the first encoder head such that the first encoder head has a first encoder head datum on the mount,
wherein stiffnesses of at least two of the constraints are different from one another, the different stiffnesses being configured to cause a position of a thermal center of the mount to align with the first encoder head datum,
wherein relative locations and the stiffnesses of the constraints cause the first encoder head datum on the mount to remain stationary with respect to the mechanical reference frame during thermal expansion of the mount over a range of temperatures,
wherein a first constraint and a second constraint from among the plurality of constrains are located on a first line of unidirectional expansion that passes through the thermal center and is parallel to the first direction, the first constraint and the second constraint being spaced apart from each other by a first constraint distance and separated from each other by the thermal center, the first constraint having a first radial stiffness $k_{R1}$ along the first line of unidirectional expansion and the second constraint having a second radial stiffness $k_{R2}$ along the first line of unidirectional expansion, where $k_{R1} \neq k_{R2}$, and
wherein a first ratio $\beta_{12}$ of a first distance from the first constraint to the thermal center and the first constraint distance is $$\beta_{12}=1/(1+(k_{R1}/k_{R2})), \text{ and}$$

the first encoder head datum is located on the mount at the thermal center.

14. The lithography system of claim 13, wherein
a third constraint from among the plurality of constraints is located on a second line of unidirectional expansion that orthogonally intersects the first line of unidirectional expansion at the thermal center, the third constraint comprising an anti-friction bearing assembly, and
the lithography system further comprises a second encoder head supported by the mount and positioned to direct light to and receive light from the encoder scale along a second direction parallel to the second line of unidirectional expansion, the second encoder head having a second encoder head datum located on the mount on the first line of unidirectional expansion.

15. The lithography system of claim 13, wherein
a third constraint and a fourth constraint from among the plurality of constraints are located on a second line of unidirectional expansion that orthogonally intersects the first line of unidirectional expansion at the thermal center, the third constraint and the fourth constraint being spaced apart from each other by a second constraint distance and separated from each other by the thermal center, the third constraint having a third radial stiffness $k_{R3}$ along the second line of unidirectional expansion and the fourth constraint having a fourth radial stiffness $k_{R4}$ along the second line of unidirectional expansion, where $k_{R3} \neq k_{R4}$,
a second ratio $\beta_{34}$ of a second distance from the third constraint to the thermal center and the second constraint distance is $$\beta_{34}=1/(1+(k_{R3}/k_{R4})), \text{ and}$$

the lithography system further comprises a second encoder head supported on the mount and positioned to direct light to and receive light from the encoder scale along a second direction parallel to the second line of unidirectional expansion, the second encoder head having a second encoder head datum located on the mount on the first line of unidirectional expansion.

16. A lithography system comprising:
a projection objective for imaging an object at an object plane to an image plane;
a mechanical reference frame comprising (i) a stage for positioning a wafer at the image plane, and (ii) an encoder scale supported on the stage;
a first encoder head positioned to direct light to and receive light from the encoder scale along a first direction; and
a mount mechanically coupled to the mechanical reference frame by a plurality of constraints, the mount supporting the first encoder head such that the first encoder head has a first encoder head datum on the mount,
wherein stiffnesses of at least two of the constraints are different from one another, the different stiffnesses being configured to cause a position of a thermal center of the mount to align with the first encoder head datum,
wherein relative locations and the stiffnesses of the constraints cause the first encoder head datum on the mount to remain stationary with respect to the mechanical reference frame during thermal expansion of the mount over a range of temperatures,
wherein a first constraint and a second constraint from among the plurality of constrains are located on a first line of unidirectional expansion that passes through the thermal center and is parallel to the first direction, the first constraint and the second constraint being spaced apart from each other by a first constraint distance and separated from each other by the thermal center, the first constraint having a first radial stiffness $k_{R1}$ along the first line of unidirectional expansion and the second constraint having a second radial stiffness $k_{R2}$ along the first line of unidirectional expansion, where $k_{R1} \neq k_{R2}$, and
wherein a first ratio $\beta_{12}$ of a first distance from the first constraint to the thermal center and the first constraint distance is $\beta_{12} = 1/(1 + (k_{R1}/k_{R2}))$, and the first encoder head datum is located on the mount at the thermal center.

17. The lithography system of claim 16, wherein
a third constraint from among the plurality of constraints is located on a second line of unidirectional expansion that orthogonally intersects the first line of unidirectional expansion at the thermal center, the third constraint comprising an anti-friction bearing assembly, and
the lithography system further comprises a second encoder head supported by the mount and positioned to direct light to and receive light from the encoder scale along a second direction parallel to the second line of unidirectional expansion, the second encoder head having a second encoder head datum on the mount on the first line of unidirectional expansion.

18. The lithography system of claim 16, wherein
a third constraint and a fourth constraint from among the plurality of constraints are located on a second line of unidirectional expansion that orthogonally intersects the first line of unidirectional expansion at the thermal center, the third constraint and the fourth constraint being spaced apart from each other by a second constraint distance and separated from each other by the thermal center, the third constraint having a third radial stiffness $k_{R3}$ along the second line of unidirectional expansion and the fourth constraint having a fourth radial stiffness $k_{R4}$ along the second line of unidirectional expansion, where $k_{R3} \neq k_{R4}$,
a second ratio $\beta_{34}$ of a second distance from the third constraint to the thermal center and the second constraint distance is $\beta_{34} = 1/(1 + (k_{R3}/k_{R4}))$, and the lithography system further comprises a second encoder head supported on the mount and positioned to direct light to and receive light from the encoder scale along a second direction parallel to the second line of unidirectional expansion, the second encoder head having a second encoder head datum located on the mount on the first line of unidirectional expansion.

* * * * *

UNITED STATES PATENT AND TRADEMARK OFFICE
CERTIFICATE OF CORRECTION

PATENT NO. : 9,200,892 B2  
APPLICATION NO. : 13/672544  
DATED : December 1, 2015  
INVENTOR(S) : Vivek G. Badami Page 1 of 1

It is certified that error appears in the above-identified patent and that said Letters Patent is hereby corrected as shown below:

In the claims,

Column 16

Line 60, in Claim 1, delete "$k_{R1} \not\equiv k_{R2}$," and insert -- $k_{R1} \neq k_{R2}$, --

Column 17

Line 50, in Claim 12, delete "$k_{R3} \not\equiv k_{R4}$," and insert -- $k_{R3} \neq k_{R4}$, --

Column 18

Line 26, in Claim 13, delete "$k_{R1} \not\equiv k_{R2}$," and insert -- $k_{R1} \neq k_{R2}$, --

Line 58, in Claim 15, delete "$k_{R3} \not\equiv k_{R4}$," and insert -- $k_{R3} \neq k_{R4}$, --

Column 19

Line 36, in Claim 16, delete "$k_{R1} \not\equiv k_{R2}$," and insert -- $k_{R1} \neq k_{R2}$, --

Column 20

Line 28, in claim 18, delete "$k_{R3} \not\equiv k_{R4}$," and insert -- $k_{R3} \neq k_{R4}$, --

Signed and Sealed this  
First Day of March, 2016

Michelle K. Lee  
*Director of the United States Patent and Trademark Office*